(12) United States Patent
Lee et al.

(10) Patent No.: US 12,048,198 B2
(45) Date of Patent: Jul. 23, 2024

(54) DISPLAY APPARATUS

(71) Applicant: Samsung Display Co., Ltd., Yongin-si (KR)

(72) Inventors: Wonse Lee, Yongin-si (KR); Sukyoung Kim, Yongin-si (KR); Donghyeon Jang, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 17/570,270

(22) Filed: Jan. 6, 2022

(65) Prior Publication Data
US 2022/0320215 A1    Oct. 6, 2022

(30) Foreign Application Priority Data

Apr. 2, 2021    (KR) .......................... 10-2021-0043499

(51) Int. Cl.
| | |
|---|---|
| *H01L 27/32* | (2006.01) |
| *G09G 3/3233* | (2016.01) |
| *H10K 59/121* | (2023.01) |
| *H10K 59/131* | (2023.01) |
| *H01L 27/12* | (2006.01) |

(52) U.S. Cl.
CPC ....... *H10K 59/1213* (2023.02); *G09G 3/3233* (2013.01); *H10K 59/131* (2023.02); *G09G 2300/0842* (2013.01); *G09G 2330/04* (2013.01); *H01L 27/124* (2013.01)

(58) Field of Classification Search
CPC .. G09G 3/3225; G09G 3/3233; G09G 3/3266; G09G 3/3275; G09G 2300/0426; G09G 2300/0819; G09G 2300/0842; G09G 2300/0861; G09G 2310/0251; G09G 2330/028; G09G 2330/04; H01L 23/60; H01L 27/124; H10K 59/1213; H10K 59/131
See application file for complete search history.

(56) References Cited

U.S. PATENT DOCUMENTS

| | | | |
|---|---|---|---|
| 7,545,354 B2 | 6/2009 | Ha et al. | |
| 7,773,056 B2 | 8/2010 | Kwak et al. | |
| 10,665,657 B2 | 5/2020 | Kang et al. | |
| 2017/0309227 A1* | 10/2017 | Ebisuno | H10K 59/131 |
| 2020/0105849 A1* | 4/2020 | Kim | H10K 59/126 |
| 2021/0201829 A1* | 7/2021 | Seo | G09G 3/3291 |

FOREIGN PATENT DOCUMENTS

| | | |
|---|---|---|
| KR | 10-0739318 B1 | 7/2007 |
| KR | 10-1130903 B1 | 3/2012 |
| KR | 10-2019-0098315 A | 8/2019 |

* cited by examiner

*Primary Examiner* — Stacy Khoo
(74) *Attorney, Agent, or Firm* — Lewis Roca Rothgerber Christie LLP

(57) ABSTRACT

A display apparatus includes: a first pixel; a second pixel adjacent to the first pixel in a row direction; a first vertical power line extending in a column direction crossing the row direction on the first pixel, and to deliver a driving voltage to the first pixel; a second vertical power line extending in the column direction on the second pixel, and to deliver the driving voltage to the second pixel; and a semiconductor pattern including a first pixel area at the first pixel, a second pixel area at the second pixel, and a connection area connecting the first vertical power line to the second vertical power line.

20 Claims, 10 Drawing Sheets

DISPLAY APPARATUS

CROSS-REFERENCE TO RELATED APPLICATION

This application claims priority to and the benefit of Korean Patent Application No. 10-2021-0043499, filed on Apr. 2, 2021, in the Korean Intellectual Property Office, the disclosure of which is incorporated by reference herein in its entirety.

BACKGROUND

1. Field

One or more embodiments relate to a display apparatus.

2. Description of the Related Art

Display apparatuses visually display data. A display apparatus may be used as a display of a small-sized product, for example, such as a cell phone, or a large-sized product, for example, such as a television.

The display apparatus includes pixels for emitting light in response to received electrical signals, so as to display an image to the outside. Each pixel includes a light-emitting element. For example, an organic light-emitting display apparatus includes an organic light-emitting diode (OLED) as the light-emitting element. In general, the organic light-emitting display apparatus may include thin-film transistors and OLEDs that are formed on a substrate, and may operate as the OLEDs emit light.

Display apparatuses are recently used in various fields, and thus, various designs for improving the quality of the display apparatuses have been attempted.

The above information disclosed in this Background section is for enhancement of understanding of the background of the present disclosure, and therefore, it may contain information that does not constitute prior art.

SUMMARY

One or more embodiments are directed to a display apparatus capable of preventing or reducing defects in pixels caused by static electricity generated from the outside.

However, the aspects and features of the present disclosure are not limited to those above, and other aspects and features may be clearly understood by one of ordinary skill in the art from the description below.

Additional aspects and features will be set forth, in part, in the description which follows, and in part, will be apparent from the description, or may be learned by practicing one or more of the presented embodiments of the present disclosure.

According to one or more embodiments of the present disclosure, a display apparatus includes: a first pixel; a second pixel adjacent to the first pixel in a row direction; a first vertical power line extending in a column direction crossing the row direction on the first pixel, and configured to deliver a driving voltage to the first pixel; a second vertical power line extending in the column direction on the second pixel, and configured to deliver the driving voltage to the second pixel; and a semiconductor pattern including a first pixel area at the first pixel, a second pixel area at the second pixel, and a connection area connecting the first vertical power line to the second vertical power line.

In an embodiment, the display apparatus may further include: an insulating layer between the semiconductor pattern and the first and second vertical power lines; a first contact plug penetrating the insulating layer, and connecting the first vertical power line to an end portion of the connection area of the semiconductor pattern; and a second contact plug penetrating the insulating layer, and connecting the second vertical power line to another end portion of the connection area of the semiconductor pattern.

In an embodiment, the display apparatus may further include: a third pixel adjacent to the second pixel in the row direction; a first voltage line configured to deliver a first initialization voltage; a second voltage line configured to deliver a second initialization voltage; and a third contact plug connecting the second pixel and the third pixel to the second voltage line.

In an embodiment, the display apparatus may further include: a fourth contact plug connecting the first pixel to the first voltage line; a fifth contact plug connecting the second pixel to the first voltage line; and a sixth contact plug connecting the third pixel to the first voltage line.

In an embodiment, the display apparatus may further include: a plurality of pixels located along the row direction and the column direction, the plurality of pixels including the first to third pixels; a plurality of first vertical power lines extending in the column direction, a first vertical power line from among the first vertical power lines being on a pixel in an $i^{th}$ row and a $(j-1)$th column from among the plurality of pixels, and configured to deliver the driving voltage to the pixel in the $i^{th}$ row and the $(j-1)$th column; a plurality of second vertical power lines extending in the column direction, a second vertical power line from among the second vertical power lines being on a pixel in the $i^{th}$ row and a $j^{th}$ column from among the plurality of pixels, and configured to deliver the driving voltage to the pixel in the $i^{th}$ row and the $j^{th}$ column; and a plurality of third contact plugs, a third contact plug from among the third contact plugs connecting the pixel in the $i^{th}$ row and the $j^{th}$ column and a pixel in the $i^{th}$ row and a $(j+1)^{th}$ column to the second voltage line, where i may be a natural number and j may be an odd or even natural number. The semiconductor pattern may further include a plurality of connection areas connecting the plurality of first vertical power lines to the second vertical power lines.

In an embodiment, the semiconductor pattern may further include: a plurality of pixel areas included in pixels arranged in the row direction from among the plurality of pixels, respectively; and a plurality of contact areas corresponding to the plurality of third contact plugs, respectively.

In an embodiment, a connection area from among the plurality of connection areas may connect a pixel area in the $i^{th}$ row and the $(j-1)$th column to a pixel area in the $i^{th}$ row and the $j^{th}$ column from among the plurality of pixel areas; and a contact area from among the plurality of contact areas may connect the pixel area in the $i^{th}$ row and the $j^{th}$ column to a pixel area in the $i^{th}$ row and the $(j+1)^{th}$ column from among the plurality of pixel areas.

In an embodiment, the plurality of connection areas and the plurality of contact areas may be alternately located along the row direction.

In an embodiment, the plurality of first vertical power lines and the plurality of second vertical power lines may be alternately located along the row direction; and the plurality of third contact plugs may be located along the column direction.

In an embodiment, each of the first to third pixels may include: a light-emitting element; a driving transistor configured to control a current flowing in the light-emitting element according to a gate-source voltage; a scan transistor configured to deliver a data voltage to the driving transistor in response to a first scan signal; a storage capacitor connected to a gate of the driving transistor, and including a first electrode and a second electrode; a first initialization transistor configured to apply a first initialization voltage to an electrode of the driving transistor in response to a second scan signal; and a second initialization transistor configured to apply a second initialization voltage to an electrode of light-emitting element in response to a third scan signal.

In an embodiment, the display apparatus may further include: a first data line extending in the column direction, and configured to deliver a first data voltage to the first pixel; and a second data line extending in the column direction, and configured to deliver a second data voltage to the second pixel. The first data line and the second data line may be between the first vertical power line and the second vertical power line.

In an embodiment, the connection area of the semiconductor pattern may electrically connect the first vertical power line to the second vertical power line.

In an embodiment, the display apparatus may further include a horizontal power line extending on the first pixel and the second pixel in the row direction, and electrically connected to the first vertical power line and the second vertical power line.

In an embodiment, the connection area may connect the first pixel area to the second pixel area.

According to one or more embodiments of the present disclosure, a display apparatus includes: first to third pixels sequentially located along a row direction; a first voltage line configured to deliver a first initialization voltage; a second voltage line configured to deliver a second initialization voltage; a power line configured to deliver a driving voltage; a first contact plug connecting the first pixel and the second pixel to the power line; and a second contact plug connecting the second pixel and the third pixel to the second voltage line.

In an embodiment, the display apparatus may further include: a third contact plug connecting the first pixel to the first voltage line; a fourth contact plug connecting the second pixel to the first voltage line; and a fifth contact plug connecting the third pixel to the first voltage line.

In an embodiment, the display apparatus may further include: a plurality of pixels located along the row direction and a column direction crossing the row direction, the plurality of pixels including the first to third pixels; a plurality of first contact plugs, a first contact plug from among the plurality of first contact plugs connecting the power line to a pixel in an $i^{th}$ row and a $(j-1)$th column and a pixel in the $i^{th}$ row and a $j^{th}$ column, from among the plurality of pixels; and a plurality of second contact plugs, a second contact plug from among the plurality of second contact plugs connecting the second voltage line to the pixel in the $i^{th}$ row and the $j^{th}$ column and a pixel in the $i^{th}$ row and a $(j+1)^{th}$ column, from among the plurality of pixels, where i may be a natural number and j may be an odd or even natural number.

In an embodiment, the plurality of first contact plugs and the plurality of second contact plugs may be alternately located along the row direction; and the plurality of first contact plugs and the plurality of second contact plugs may be located along the column direction.

In an embodiment, the power line may include a plurality of vertical power lines, each extending in the column direction; the second voltage line may include a plurality of vertical lines, each extending in the column direction; and the plurality of vertical power lines and the plurality of vertical lines may be alternately located along the row direction.

In an embodiment, the power line may further include a plurality of horizontal power lines, each extending in the row direction, and electrically connected to the plurality of vertical power lines.

The above and other aspects and features of the present disclosure will become more apparent from the following detailed description, the drawings, and the claims and their equivalents.

These general and specific embodiments may be implemented by using a system, a method, a computer program, or any suitable combination thereof.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
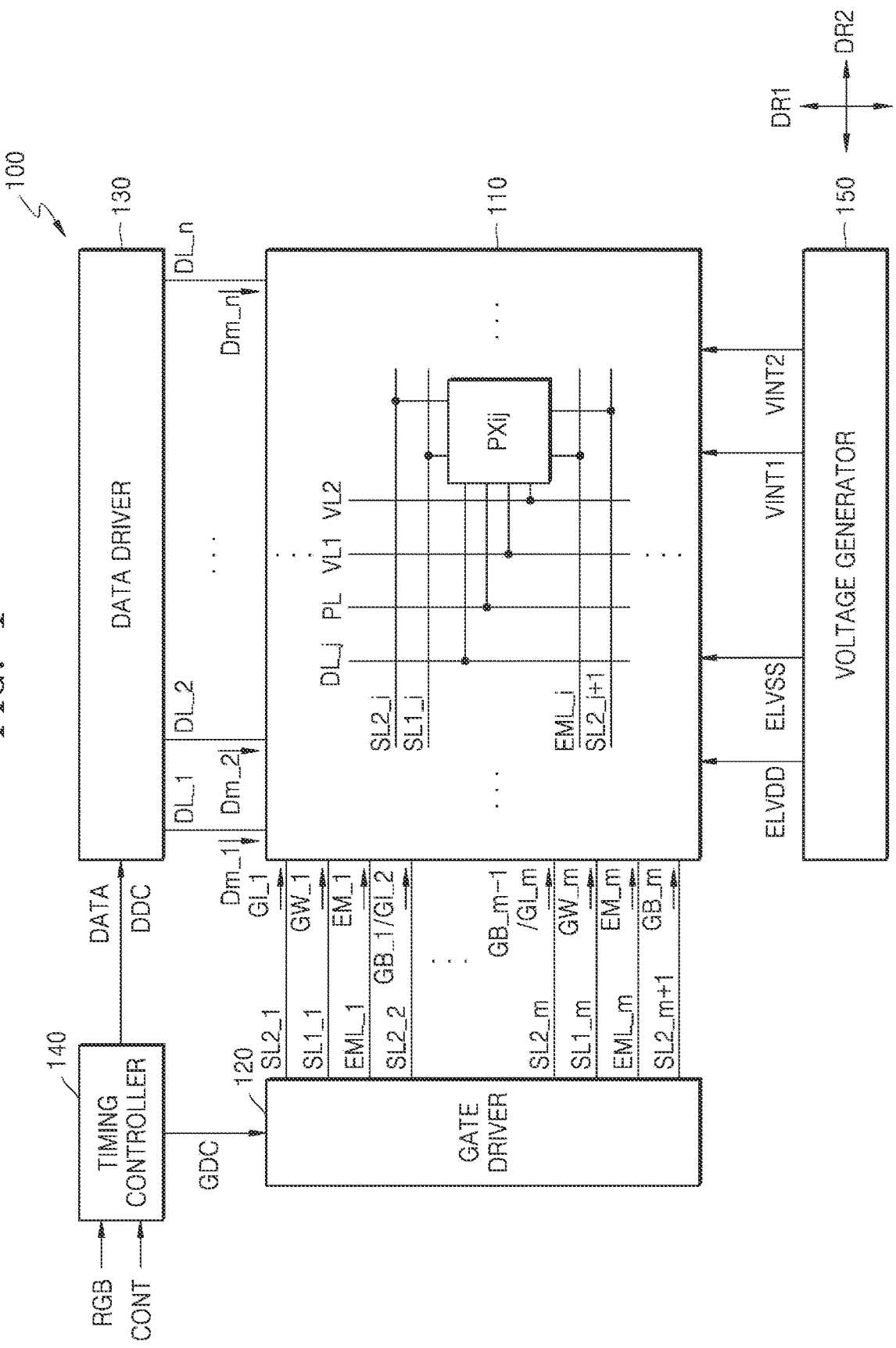
FIG. 1 is a schematic block diagram of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," "electrically connected to," "coupled to," or "electrically coupled to" another element or layer, it can be directly on, connected to, electrically connected to, coupled to, or electrically coupled to the other element or layer, or one or more intervening elements or layers may be present. Similarly, when a layer, region, or component is referred to as being "formed on" another layer, region, or component, it can be directly formed on the other layer, region, or component, or indirectly formed on the other layer, region, or component. In other words, one or more intervening layers, regions, or components may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic block diagram of a display apparatus according to an embodiment.

The display apparatus 100 may be an organic light-emitting display apparatus including a light-emitting element, for example, an organic light-emitting diode (OLED), in which the brightness thereof may be changed according to a current. As another example, the display apparatus 100 may be an inorganic light-emitting display (or inorganic EL display) apparatus or a quantum dot light-emitting display apparatus 100. In other words, an emission layer of the light-emitting element of the display apparatus 100 may include an organic or inorganic material, quantum dots, both an organic material and quantum dots, both an inorganic material and quantum dots, or organic and inorganic materials and quantum dots. Hereinafter, a case where the display apparatus 100 is an organic light-emitting display apparatus 100 will be mainly described in more detail.

Referring to FIG. 1, the organic light-emitting display apparatus 100 includes a display 110, a gate driver 120, a data driver 130, a timing controller 140, and a voltage generator 150.

The display 110 includes a plurality of pixels PX including a pixel PXij arranged in an $i^{th}$ row and a $j^{th}$ column (where i and j are natural numbers). For convenience of illustration, FIG. 1 illustrates only one pixel PXij from among the plurality of pixels PX, but m×n pixels PX (where m and n are natural numbers) may be arranged, for example, in a matrix form. Here, i may be less than or equal to m, and j may be less than or equal to n.

A pixel PX including a pixel circuit including seven transistors and one capacitor may be mainly described as an illustrative example. However, the present disclosure is not limited thereto, and the pixel circuit of the pixel PX may have any suitable number of transistors and capacitors, for example, such as two transistors and one capacitor.

The pixels PX may be connected to first scan lines SL1_1 to SL1_m, second scan lines SL2_1 to SL2_m+1, emission control lines EML_1 to EML_m, and data lines DL_1 to DL_n. The pixels PX may be connected to a power line PL, a first voltage line VL1, and a second voltage line VL2. For example, as illustrated in FIG. 1, the pixel PXij arranged in the $i^{th}$ row and the $j^{th}$ column may be connected to the first scan line SL1_i, the second scan line SL2_i, the emission control line EML_i, the data line DL_j, the power line PL, the first voltage line VL1, the second voltage line VL2, and the second scan line SL2_i+1. The second scan line SL2_i+1 may be referred to as a third scan line of the pixel PXij.

According to another example, the pixel PXij may be connected to some of the first scan line SL1_i, the second scan line SL2_i, the emission control line EML_i, the data line DL_j, the power line PL, the first voltage line VL1, the second voltage line VL2, and the second scan line SL2_i+1. For example, the pixel PXij may be connected to the first scan line SL1_i, the data line DL_j, and the power line PL.

The data lines DL_1 to DL_n may extend in a first direction DR1 (or a column direction), and may be connected to pixels PX arranged in the same column. The first scan lines SL1_1 to SL1_m, the second scan lines SL2_1 to SL2_m+1, and the emission control lines EML_1 to EML_m may extend in a second direction DR2 (or a row direction) crossing the first direction DR1, and may be connected to pixels PX arranged in the same row.

Figure 8:
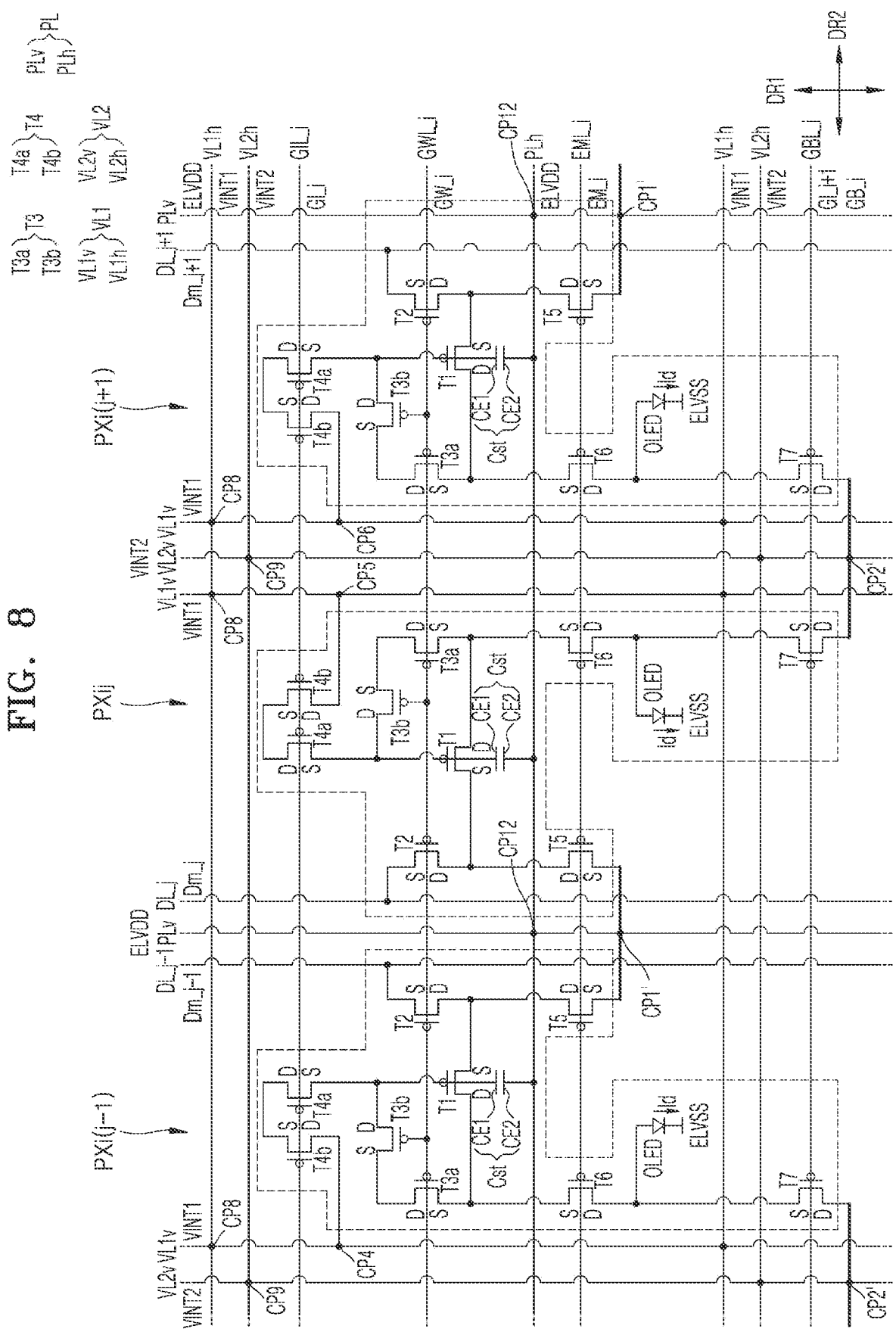
FIG. 8 is an equivalent circuit diagram of a plurality of pixels according to another embodiment.

The power line PL may include vertical power lines extending in the first direction DR1, and the vertical power lines may be connected to the pixels PX arranged in the same column. In an embodiment, as illustrated in FIG. 8 below, the vertical power lines may be shared between pixels PX that are adjacent to each other in the second direction DR2.

Figure 3A:
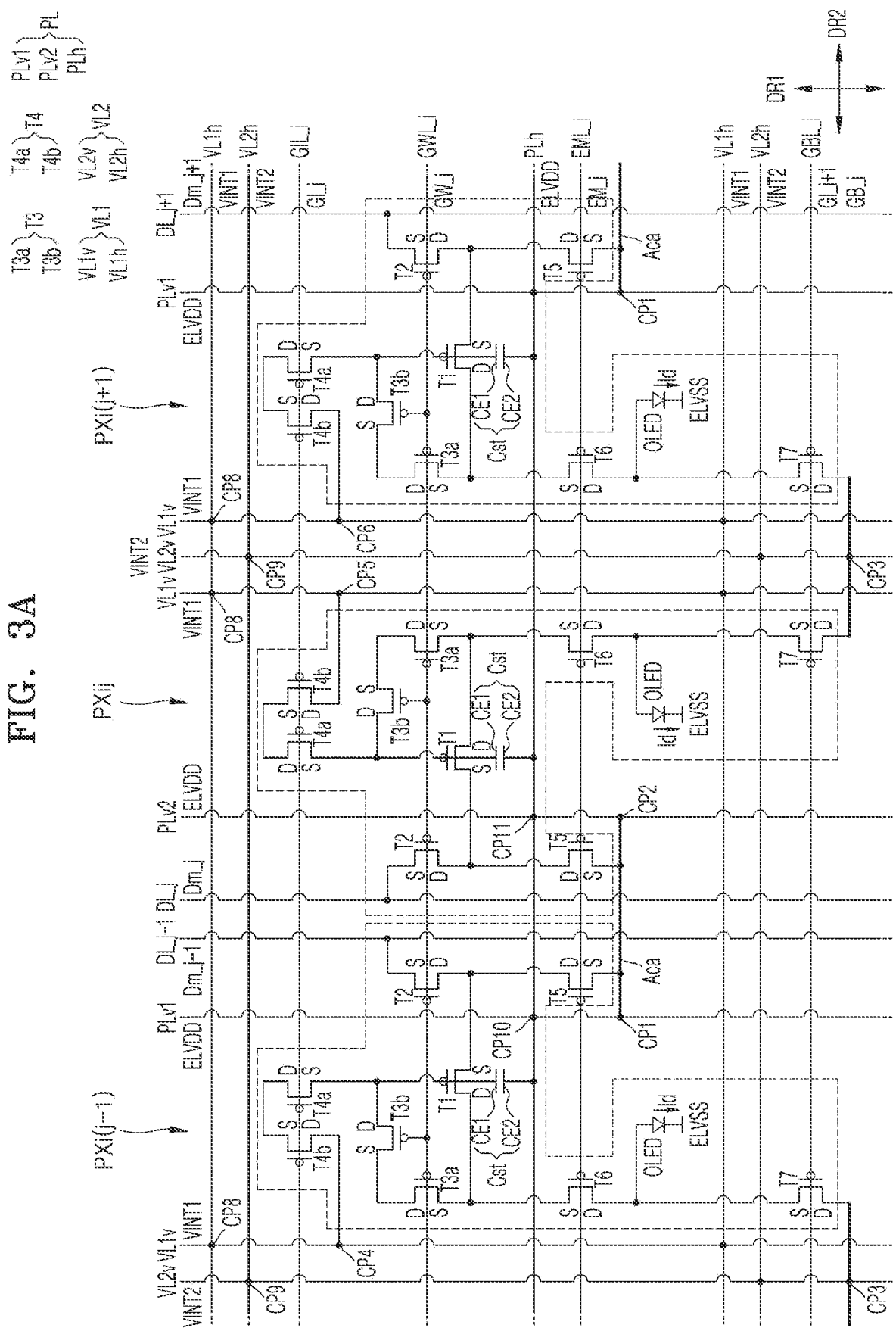
FIG. 3A is an equivalent circuit diagram of a plurality of pixels according to an embodiment.

As illustrated in FIG. 3A below, the power line PL may include horizontal power lines extending in the second direction DR2, and the horizontal power lines may be connected to the pixels PX arranged in the same row. The horizontal power lines may be connected to the vertical power lines.

Each of the first voltage line VL1 and the second voltage line VL2 may include vertical lines extending in the first direction DR1, and the vertical lines may be connected to the pixels PX arranged in the same column. In an embodiment, as illustrated in FIGS. 3A and 8 below, the vertical lines of the second voltage line VL2 may be shared between the pixels PX that are adjacent to each other in the second direction DR2.

As illustrated in FIG. 3A below, at least one of the first voltage line VL1 and the second voltage line VL2 may include horizontal lines extending in the second direction DR2, and the horizontal lines may be connected to the vertical lines.

The first scan lines SL1_1 to SL1_m may be respectively configured to transmit first scan signals GW_1 to GW_m output from the gate driver 120 to the pixels PX in the same row. The second scan lines SL2_1 to SL2_m may be respectively configured to transmit second scan signals GI_1 to GI_m output from the gate driver 120 to the pixels PX in the same row. The second scan lines SL2_2 to SL2_m+1 may be respectively configured to transmit third scan signals GB_1 to GB_m output from the gate driver 120 to the pixels PX in the same row. For example, the second scan signal GI_i and the third scan signal GB_i−1 may be the same or substantially the same signal transmitted through the second scan line SL2_i.

The emission control lines EML_1 to EML_m may be respectively configured to transmit emission control signals EM_1 to EM_m, which may be output from the gate driver 120, to the pixels PX arranged in the same row. The data lines DL_1 to DL_n are respectively configured to transmit data voltages Dm_1 to Dm_n, which are output from the data driver 130, to the pixels PX arranged in the same column. For example, the pixel PXij arranged in the $i^{th}$ row and the $j^{th}$ column receives the first to third signals GW_i, GI_i, and GB_i, the data voltage Dm_j, and the emission control signal EM_i.

The power line PL is configured to transmit, to the pixels PX, a first driving voltage ELVDD output from the voltage generator 150. The first voltage line VL1 is configured to transmit, to the pixels PX, a first initialization voltage VINT1 output from the voltage generator 150. The second voltage line VL2 is configured to transmit, to the pixels PX, a second initialization voltage VINT2 output from the voltage generator 150.

The pixel PXij includes a light-emitting element, and a driving transistor that controls a value of a current flowing to the light-emitting element according to the data voltage Dm_j. The data voltage Dm_j is output from the data driver 130, and is received by the pixel PXij through the data line DL_j. The light-emitting element may be, for example, an organic light-emitting diode (OLED). As the light-emitting element emits light having a brightness corresponding to the value of the current transmitted from the driving transistor, the pixel PXij may express a gradation (e.g., a gray level) corresponding to the data voltage Dm_j. The pixel PX may correspond to, for example, a sub-pixel that is part of a unit pixel by which a full color is displayed. The pixel PXij may further include at least one switching transistor, and at least one capacitor. The pixel PXij will be described in more detail below.

The voltage generator 150 may generate voltages used to drive the pixel PXij. For example, the voltage generator 150 may generate the first driving voltage ELVDD, the second driving voltage ELVSS, the first initialization voltage VINT1, and the second initialization voltage VINT2. A level of the first driving voltage ELVDD may be higher than a level of the second driving voltage ELVSS. A level of the second initialization voltage VINT2 may be higher than a level of the first initialization voltage VINT1. The level of the second initialization voltage VINT2 may be higher than the level of the second driving voltage ELVSS. A difference between the second initialization voltage VINT2 and the second driving voltage ELVSS may be less than a threshold voltage used for the light-emitting element of the pixel PX to emit light.

In some embodiments, the voltage generator 150 may generate a first gate voltage VGH and a second gate voltage VGL to control a switching transistor of the pixel PXij, and may provide the first gate voltage VGH and the second gate voltage VGL to the gate driver 120. When the first gate voltage VGH is applied to a gate of the switching transistor, the switching transistor may be turned off, and when the second gate voltage VGL is applied to the gate of the switching transistor, the switching transistor may be turned on. The first gate voltage VGH may be referred to as a turn-off voltage, and the second gate voltage VGL may be referred to as a turn-on voltage. The switching transistors of the pixel PXij may be a P-type metal-oxide-semiconductor field-effect transistor (MOSFET), and a level of the first gate voltage VGH may be higher than that of the second gate voltage VGL. In some embodiments, the voltage generator 150 may generate gamma reference voltages, and may provide the gamma reference voltages to the data driver 130.

The timing controller 140 may control operation timings of the gate driver 120 and the data driver 130, thus controlling the display 110. The pixels PX of the display 110 may receive a new data voltage Dm in every frame period, and may emit light having a brightness corresponding to the received data voltage Dm, thereby displaying an image corresponding to image source data RGB of one frame.

According to an embodiment, one frame period may include a gate initialization period, a data write and anode initialization period, and an emission period. In the gate initialization period, the first initialization voltage VINT1 may be applied to the pixels PX in synchronization with the second scan signal GI. In the data write and anode initialization period, the data voltage Dm may be applied to the pixels PX in synchronization with the first scan signal GW, and the second initialization voltage VINT2 may be applied to the pixels PX in synchronization with the third scan signal GB. In the emission period, the pixels PX of the display 110 may emit light.

The timing controller 140 receives the image source data RGB and a control signal CONT from the outside. The timing controller 140 may convert the image source data RGB into image data DATA based on features of the display 110 and the pixels PX. The timing controller 140 may provide the image data DATA to the data driver 130.

The control signal CONT may include a vertical synchronization signal Vsync, a horizontal synchronization signal Hsync, a data enable signal DE, a clock signal CLK, and/or the like. The timing controller 140 may control the operation timings of the gate driver 120 and the data driver 130 in response to the control signal CONT. In some embodiments, the timing controller 140 may count data enable signals DE in a horizontal scanning period, and determine a frame period. In this case, the vertical synchronization signal Vsync and the horizontal synchronization signal Hsync provided from the outside may be omitted. The image source data RGB includes luminance information of the pixels PX. The luminance information may have gray levels having a fixed number, for example, such as $1024(=2^{10})$, $256(=2^8)$, or $64(=2^6)$.

The timing controller 140 may generate control signals including a gate timing control signal GDC for controlling the operation timing of the gate driver 120, and a data timing control signal DDC for controlling the operation timing of the data driver 130.

The gate timing control signal GDC may include a gate start pulse GSP, a gate shift clock GSC, a gate output enable signal GOE, and/or the like. The gate start pulse GSP is provided to the gate driver 120 to generate a first scan signal at an initial point of a scanning period. The gate shift clock GSC is a clock signal that is commonly input to the gate driver 120, and is configured to shift the gate start pulse GSP. The gate output enable signal GOE is configured to control the output from the gate driver 120.

The data timing control signal DDC may include a source start pulse SSP, a source sampling clock SSC, a source output enable signal SOE, and/or the like. The source start pulse SSP is configured to control a data sampling start point of the data driver 130, and is provided to the data driver 130 at the initial point of the scanning period. The source sampling clock SSC is a clock signal for controlling a sampling operation of data in the data driver 130 based on a rising or falling edge of the clock signal. The source output enable signal SOE is configured to control the output from the data driver 130. However, the present disclosure is not limited thereto, and the source start pulse SSP provided to the data driver 130 may be omitted, depending on data transmission methods.

The gate driver 120 may use the first and second gate voltages VGH and VGL provided from the voltage generator 150, and may sequentially generate the first scan signals GW_1 to GW_m, the second scan signals GI_1 to GI_m, and the third scan signals GB_1 to GB_m in response to the gate timing control signal GDC provided from the timing controller 140.

The data driver 130 may sample and latch the image data DATA provided from the timing controller 140 in response to the data timing control signal DDC provided from the timing controller 140, thus converting the image data DATA into data in a parallel data system. When converting the image data DATA into the data in the parallel data system, the data driver 130 may convert the image data DATA into a gamma reference voltage, and may then convert the gamma reference voltage into a data voltage of an analog type. The data driver 130 provides the data voltages Dm_1 to Dm_n to the pixels PX through the data lines DL_1 to DL_n. The pixels PX receive the data voltages Dm_1 to Dm_n in response to the first scan signals GW_1 to GW_m.

Figure 2:
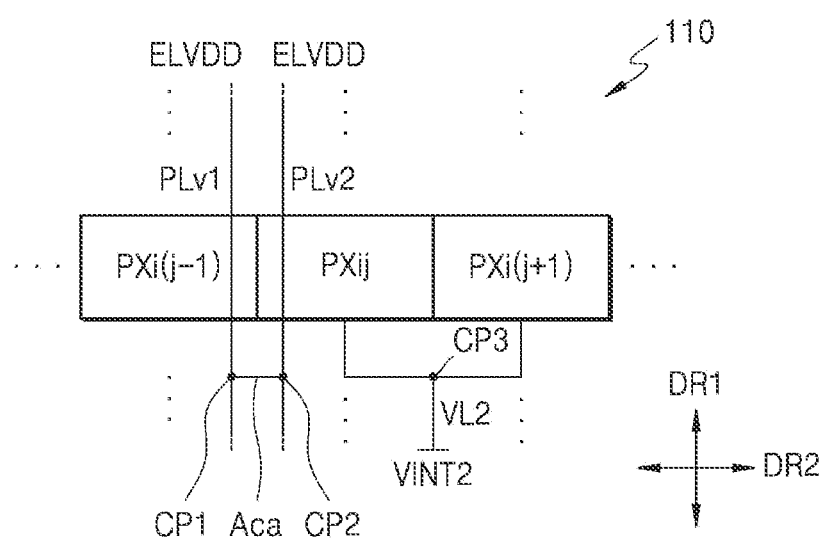
FIG. 2 schematically illustrates a plurality of pixels according to an embodiment.

FIG. 2 schematically illustrates a plurality of pixels according to an embodiment.

Referring to FIG. 2, the display 110 of the display apparatus includes a plurality of pixels PX, for example, such as a pixel PXi(j−1) arranged in the $i^{th}$ row and a $(j−1)^{th}$ column (hereinafter, referred to as a first pixel), the pixel PXij arranged in the $i^{th}$ row and the $j^{th}$ column (hereinafter, referred to as a second pixel), and a pixel PXi(j+1) arranged in the $i^{th}$ row and a $(j+1)^{th}$ column (hereinafter, referred to as a third pixel).

The pixels PX may be arranged in the first direction DR1 (or the column direction) and the second direction DR2 (or the row direction). For example, the pixels PX may be arranged in a matrix form.

In an embodiment, as described above with reference to FIG. 1, the power line PL may include the vertical power lines extending in the first direction DR1. For example, the power line PL may include a first vertical power line PLv1 and a second vertical power line PLv2. The first vertical power line PLv1 may extend on the first pixel PXi(j−1) in the first direction DR1, and may be configured to deliver the first driving power ELVDD to the first pixel PXi(j−1). The second vertical power line PLv2 may extend on the second pixel PXij in the first direction DR1, and may be configured to deliver the first driving power ELVDD to the second pixel PXij.

Figure 4:
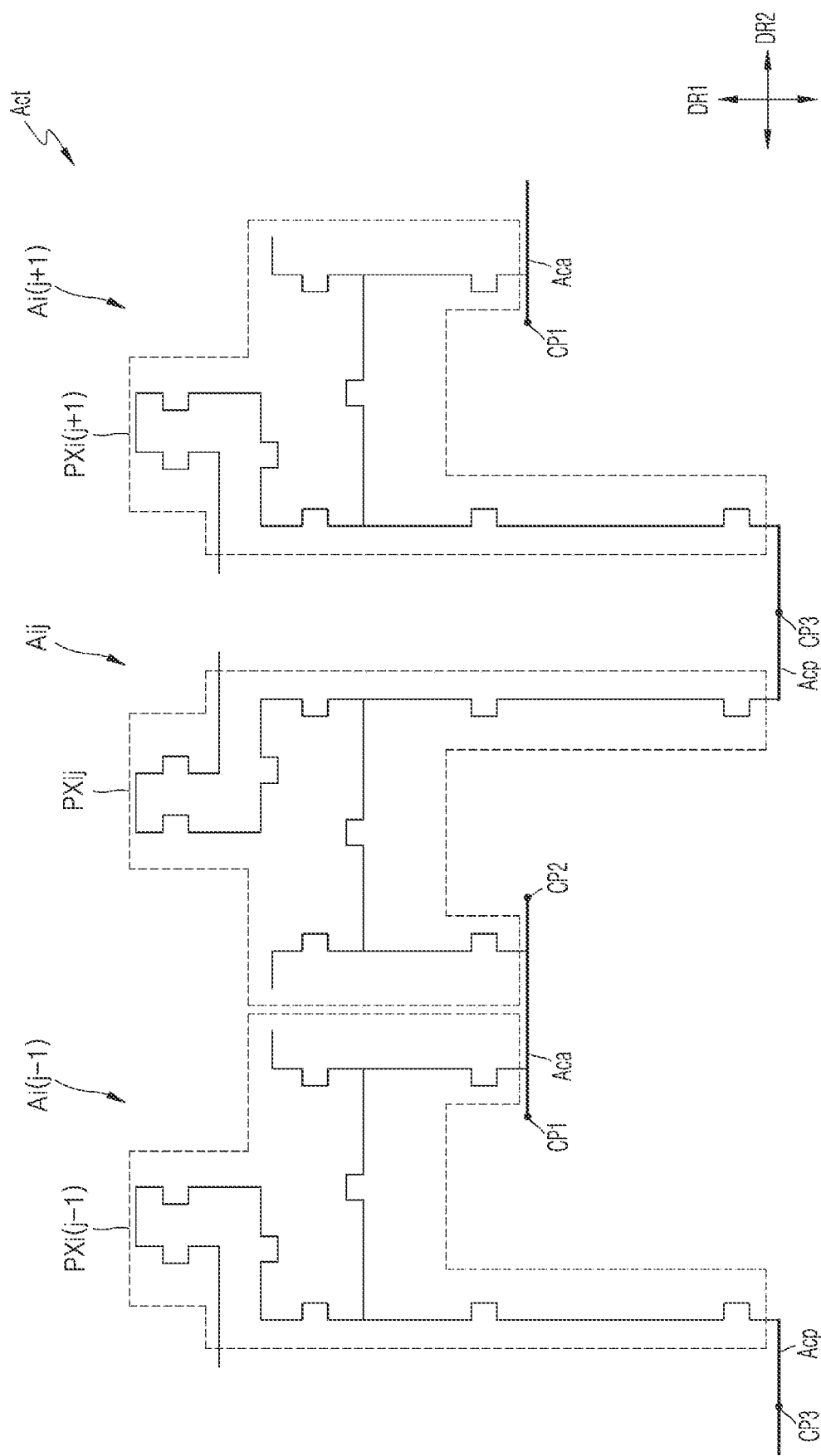
FIG. 4 illustrates a semiconductor pattern according to an embodiment.

In an embodiment, the first vertical power line PLv1 may be connected to the second vertical power line PLv2 by a connection area Aca of a semiconductor pattern Act (e.g., see FIG. 4). The first vertical power line PLv1 may always be electrically connected to the second vertical power line PLv2 through the connection area Aca of the semiconductor pattern Act. For example, as illustrated in FIG. 2, the first vertical power line PLv1 may be connected to an end portion of the connection area Aca of the semiconductor pattern Act by a first contact plug CP1. The second vertical power line PLv2 may be connected to another end portion of the connection area Aca of the semiconductor pattern Act by a second contact plug CP2. Because the first vertical power line PLv1 and the second vertical power line PLv2 are connected to the end portion and the other end portion of the connection area Aca, respectively, of the semiconductor pattern Act, the first vertical power line PLv1 may be connected to the second vertical power line PLv2.

Figure 5:
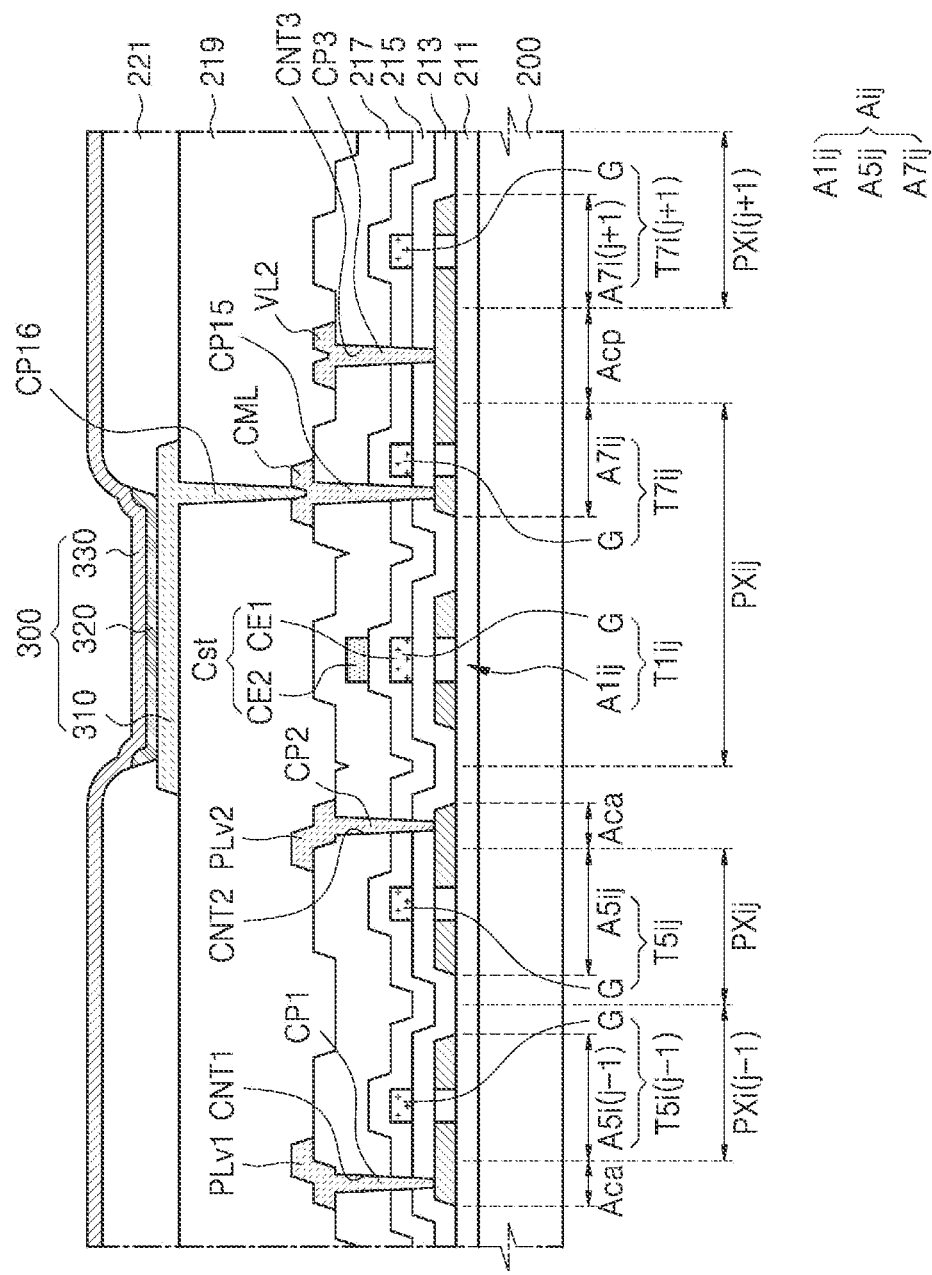
FIG. 5 is a schematic cross-sectional view of a portion of a display apparatus according to an embodiment.

As illustrated in FIG. 5, the first contact plug CP1 and the second contact plug CP2 may correspond to portions of a conductive layer. The first contact plug CP1 and the second contact plug CP2 may correspond to portions of the conductive layer buried in a contact hole formed in (e.g., penetrating through) an insulating layer.

In an embodiment, the second pixel PXij and the third pixel PXi(j+1) may share a third contact plug CP3. The third contact plug CP3 may be connected to the second voltage line VL2 through which the second initialization voltage VINT2 is applied. As illustrated in FIG. 5, the third contact plug CP3 may correspond to a portion of the conductive layer. The third contact plug CP3 may correspond to a portion of the conductive layer buried in the contact hole formed in (e.g., penetrating through) the insulating layer.

Because the second pixel PXij and the third pixel PXi(j+1) share the third contact plug CP3, the second pixel PXij and the third pixel PXi(j+1) may be connected to the second voltage line VL2 through the third contact plug CP3. In other words, the third contact plug CP3 may connect the second pixel PXij and the third pixel PXi(j+1) to the second voltage line VL2.

Figure 3B:
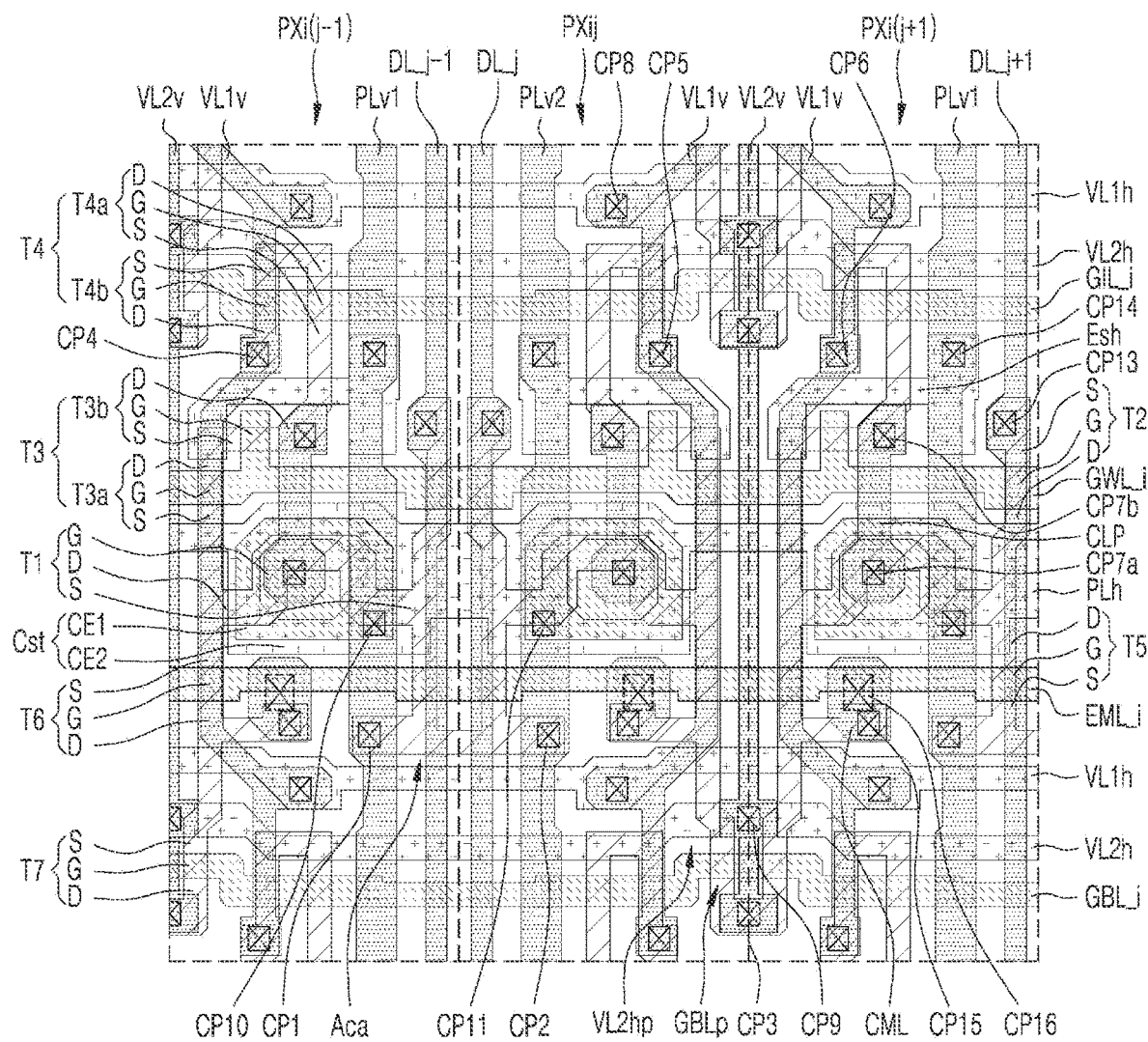
FIG. 3B is a schematic plan view of a plurality of pixels according to an embodiment.

FIG. 3A is an equivalent circuit diagram of a plurality of pixels according to an embodiment, and FIG. 3B is a schematic plan view of a plurality of pixels according to an embodiment.

FIGS. 3A and 3B illustrate the first pixel PXi(j−1), the second pixel PXij, and the third pixel PXi(j+1) in more detail. Because the first pixel PXi(j−1), the second pixel PXij, and the third pixel PXi(j+1) are arranged in the same row as each other, the first pixel PXi(j−1), the second pixel PXij, and the third pixel PXi(j+1) may each be connected to the first to third scan lines GWL_i, GIL_i, and GBL_i and the emission control line EML_i. The first pixel PXi(j−1), the second pixel PXij, and the third pixel PXi(j+1) may be sequentially arranged along the second direction DR2, and may be adjacent to one another.

Referring to FIGS. 3A and 3B, the first pixel PXi(j−1) is connected to the first to third scan lines GWL_i, GIL_i, and GBL_i configured to transmit the first to third scan signals GW_i, GI_i, and GB_i, respectively, a data line DL_j−1 (hereinafter, referred to as a first data line) configured to deliver a data voltage Dm_j−1, and the emission control line EML_i configured to transmit the emission control signal EM_i. The first pixel PXi(j−1) is connected to the power line PL configured to deliver the first driving voltage EVLDD, the first voltage line VL1 configured to deliver the first initialization voltage VINT1, and the second voltage line VL2 configured to deliver the second initialization voltage VINT2. The first pixel PXi(j−1) is connected to a common electrode to which the second driving voltage ELVSS is applied.

The first scan line GWL_i corresponds to the first scan line SL1_i of FIG. 1, the second scan line GIL_i corresponds to the second scan line SL2_i of FIG. 1, and the third scan line GBL_i corresponds to the second scan line SL2_i+1 of FIG. 1.

The second pixel PXij is connected to the first to third scan lines GWL_i, GIL_i, and GBL_i configured to transmit the first to third scan signals GW_i, GI_i, and GB_i, respectively, the data line DL_j (hereinafter, referred to as a second data line) configured to deliver a data voltage Dm_j, and the emission control line EML_i configured to transmit the emission control signal EM_i. The second pixel PXij is connected to the power line PL configured to deliver the first driving voltage ELVDD, the first voltage line VL1 configured to deliver the first initialization voltage VINT1, and the second voltage line VL2 configured to deliver the second initialization voltage VINT2. The second pixel PXij is connected to the common electrode to which the second driving voltage ELVSS is applied. The second pixel PXij may correspond to the pixel PXij of FIG. 1.

The third pixel PXi(j+1) is connected to the first to third scan lines GWL_i, GIL_i, and GBL_i configured to transmit the first to third scan signals GW_i, GI_i, and GB_i, respectively, a data line DL_j+1 (hereinafter, referred to as a third data line) configured to deliver a data voltage Dm_j+1, and the emission control line EML_i configured to transmit the emission control signal EM_i. The third pixel PXi(j+1) is connected to the power line PL configured to transmit the first driving voltage ELVDD, the first voltage line VL1 configured to transmit the first initialization voltage VINT1, and the second voltage line VL2 configured to transmit the second initialization voltage VINT2. The third pixel PXi(j+1) is connected to the common electrode to which the second driving voltage ELVSS is applied.

The power line PL may include a plurality of first vertical power lines PLv1 and a plurality of second vertical power lines PLv2. The first vertical power lines PLv1 and the second vertical power lines PLv2 may each extend in the first direction DR1, and may be configured to deliver the first driving voltage ELVDD to the pixels PX in the same column.

In an embodiment, a pixel column, in which the first vertical power lines PLv1 are configured to deliver the first driving voltage EVLDD, may be different from a pixel column, in which the second vertical power lines PLv2 are configured to deliver the first driving voltage EVLDD.

For example, the pixel column, in which the first vertical power lines PLv1 are configured to deliver the first driving voltage EVLDD, and the pixel column, in which the second vertical power lines PLv2 are configured to deliver the first driving voltage EVLDD, may be alternately arranged with each other. In other words, the first vertical power lines PLv1 and the second vertical power lines PLv2 may be alternately arranged along the second direction DR2. For example, the first vertical power lines PLv1 may be configured to deliver the first driving voltage EVLDD to the pixels PX in odd columns, and the second vertical power lines PLv2 may be configured to deliver the first driving voltage EVLDD to the pixels PX in even columns. As another example, the first vertical power lines PLv1 may be configured to deliver the first driving voltage ELVDD to the pixels PX arranged in the even columns, and the second vertical power lines PLv2 may be configured to deliver the first driving voltage ELVDD to the pixels PX arranged in the odd columns.

In an embodiment, the first vertical power lines PLv1 may be connected to adjacent ones of the second vertical power lines PLv2 through the connection areas Aca of the semiconductor pattern Act (e.g., see FIG. 4), respectively. The connection areas Aca of the semiconductor pattern Act may always connect the first vertical power lines PLv1 to the adjacent ones of the second vertical power lines PLv2.

For example, first vertical power lines PLv1 and second vertical power lines PLv2, which are adjacent to each other in the second direction DR2 from among the first vertical power lines PLv1 and the second vertical power lines PLv2, may be connected to each other through the connection areas Aca of the semiconductor pattern Act. As illustrated in FIGS. 3A and 3B, the first vertical power line PLv1 arranged on the first pixel PXi(j−1) may be connected to one end portion of a corresponding connection area Aca of the semiconductor pattern Act through the first contact plug CP1, and the second vertical power line PLv2 arranged on the second pixel PXij may be connected to the other end portion of the corresponding connection area Aca of the semiconductor pattern Act through the second contact plug CP2. The first vertical power line PLv1 arranged on the first pixel PXi(j−1) may be adjacent, in the second direction DR2, to the second vertical power line PLv2 arranged on the second pixel PXij, and may be connected thereto through the corresponding connection area Aca of the semiconductor pattern Act. Also, although not completely shown in FIGS. 3A and 3B, a first vertical power line PLv1 arranged on the third pixel PXi(j+1) may be connected to the end portion of a corresponding connection area Aca of the semiconductor pattern Act through the first contact plug CP1, and a second vertical power line PLv2 arranged on a pixel in the $i^{th}$ row and a (j+2)th column may be connected to the other end portion of the corresponding connection area Aca of the semiconductor pattern Act through the second contact plug CP2. The first vertical power line PLv1 arranged on the third pixel PXi(j+1) and the second vertical power lines PLv2 arranged on the pixel in the $i^{th}$ row and the (j+2)th column may be adjacent to each other in the second direction DR2, and may be connected to each other through the corresponding connection area Aca of the semiconductor pattern Act.

The power line PL may include a plurality of horizontal power lines PLh. Each horizontal power line PLh may extend in the second direction DR2, and may be configured to transmit the first driving voltage ELVDD to each of the pixels PX in the same row.

The horizontal power lines PLh may be connected to the first vertical power lines PLv1 and the second vertical power lines PLv2. For example, as illustrated in FIGS. 3A and 3B, the horizontal power lines PLh may be connected to the first vertical power lines PLv1 by a tenth contact plug CP10, and to the second vertical power lines PLv2 by an eleventh contact plug CP11.

The data lines DL_j−1, DL_j, and DL_j+1 may each extend in the first direction DR1, and may be configured to deliver the data voltages Dm_j−1, Dm_j, and Dm_j+1 to the pixels PX arranged in the same column, respectively. For example, as illustrated in FIG. 3B, the data lines DL_j−1, DL_j, and DL_j+1 may be connected to the first to third pixels PXi(j−1), PXij, and PXi(j+1) by thirteenth contact plugs CP13, respectively.

In an embodiment, the data lines DL_j−1, DL_j, and DL_j+1 may be arranged between the first vertical power lines PLv1 and the second vertical power lines PLv2, which are adjacent to each other in the second direction DR2. For example, as illustrated in FIGS. 3A and 3B, the first data line DL_j−1 and the second data line DL_j may be arranged between the first vertical power line PLv1 arranged on the first pixel PXi(j−1) and the second vertical power line PLv2 arranged on the second pixel PXij. Although not completely shown in FIGS. 3A and 3B, the third data line DL_j+1 may be arranged between the first vertical power line PLv1 arranged on the third pixel PXi(j+1) and the second vertical power line PLv2 arranged on the pixel arranged in the $i^{th}$ row and the $(j+2)^{th}$ column.

In an embodiment, as illustrated in FIGS. 3A and 3B, the data lines DL_j−1, DL_j, and DL_j+1 may at least partially overlap with the connection areas Aca of the semiconductor pattern Act.

The first voltage line VL1 may include first vertical lines VL1v and first horizontal lines VL1h. The first vertical lines VL1v may each extend in the first direction DR1, and may be configured to deliver the first initialization voltage VINT1 to the pixels PX arranged in the same column. The first horizontal lines VL1h may each extend in the second direction DR2, and may be configured to deliver the first initialization voltage VINT1 to the pixels PX arranged in the same row. For example, as illustrated in FIGS. 3A and 3B, the first pixel PXi(j−1) may be connected to a corresponding one of the first vertical lines VL1v of the first voltage line VL1 by a fourth contact plug CP4, the second pixel PXij may be connected to a corresponding one of the first vertical lines VL1v of the first voltage line VL1 by a fifth contact plug CP5, and the third pixel PXi(j+1) may be connected to a corresponding one of the first vertical lines VL1v of the first voltage line VL1 by a sixth contact plug CP6.

The first vertical lines VL1v may be connected to the first horizontal lines VL1h. For example, as illustrated in FIGS. 3A and 3B, the first vertical lines VL1v may be connected to the first horizontal lines VL1h by eighth contact plugs CP8.

FIGS. 3A and 3B illustrate that the first voltage lines VL1 include the first vertical lines VL1v and the first horizontal lines VL1h. In another embodiment, however, one of the first vertical lines VL1v or the first horizontal lines VL1h may be omitted. In another embodiment, some of the first vertical lines VL1v may be omitted, or some of the first horizontal lines VL1h may be omitted.

The second voltage lines VL2 may include second vertical lines VL2v and second horizontal lines VL2h. The second vertical lines VL2v may each extend in the first direction DR1, and may be configured to deliver the second initialization voltage VINT2 to the pixels PX in the same column. The second horizontal lines VL2h may each extend in the second direction DR2, and may be configured to deliver the second initialization voltage VINT2 to the pixels PX in the same row.

The second vertical lines VL2v may be connected to the second horizontal lines VL2h. For example, as illustrated in FIGS. 3A and 3B, the second vertical lines VL2v may be connected to the second horizontal lines VL2h by ninth contact plugs CP9.

FIGS. 3A and 3B illustrate that the second voltage lines VL2 include the second vertical lines VL2v and the second horizontal lines VL2h. In another example, however, one of the second vertical lines VL2v or the second horizontal lines VL2h may be omitted. In another embodiment, some of the second vertical lines VL2v may be omitted, or some of the second horizontal lines VL2h may be omitted.

In an embodiment, the second pixel PXij and the third pixel PXi(j+1) may share the third contact plug CP3. Because the second pixel PXij and the third pixel PXi(j+1) share the third contact plug CP3, the second pixel PXij and the third pixel PXi(j+1) may be connected to the second voltage lines VL2 through the third contact plug CP3. The second pixel PXij and the third pixel PXi(j+1) may receive the second initialization voltage VINT2 through the third contact plug CP3. In other words, the third contact plug CP3 may connect the second pixel PXij and the third pixel PXi(j+1) to the second voltage line VL2.

In an embodiment, the second pixel PXij and the third pixel PXi(j+1) may share the second voltage line VL2. For example, as illustrated in FIGS. 3A and 3B, the second pixel PXij and the third pixel PXi(j+1) may share the second vertical line VL2v of the second voltage line VL2. In this case, the number of second vertical lines VL2v of the second voltage line VL2 per unit area may be less than the number of first vertical lines VL1v of the first voltage line VL1 per unit area.

In an embodiment, as illustrated in FIG. 3B, the third scan line GBL_i may surround (e.g., around a periphery of) at least part of the third contact plug CP3. A portion GBLp of the third scan line GBL_i, which is adjacent to the third contact plug CP3, may be bent at least once. For example, a planar shape of the portion GBLp of the third scan line GBL_i may be an omega (0) shape.

In an embodiment, as illustrated in FIG. 3B, the second horizontal line VL2h may surround (e.g., around a periphery of) at least part of the portion GBLp of the third scan line GBL_i. A portion VL2hp of the second horizontal line VL2h, which is adjacent to the portion GBLp of the third scan line GBL_i, may be bent at least once. In other words, the portion VL2hp of the second horizontal line VL2h, which is adjacent to the third contact plug CP3, may be bent at least once. For example, a planar shape of the portion VL2hp of the second horizontal line VL2h may be an omega ($\Omega$) shape.

Although not illustrated in FIGS. 3A and 3B, the pixels PX arranged in an $(i-1)^{th}$ row, the pixels PX arranged in an $(i+1)^{th}$ row, and the like may be formed in the same or substantially the same manner as those of the pixels PX (e.g., PXi(j-1), PXij, and PXi(j+1)) arranged in the $i^{th}$ row. In this case, the first contact plugs CP1, the second contact plugs CP2, the third contact plugs CP3, and the like may each be arranged along the first direction DR1.

Hereinafter, elements included in the first pixel PXi(j-1), the second pixel PXij, and the third pixel PXi(j+1) will be described in more detail. Because an equivalent circuit diagram of each of the first pixel PXi(j-1) and the third pixel PXi(j+1) may be the same or substantially the same as that of the second pixel PXij, the elements of the second pixel PXij will be described in more detail, and redundant description may not be repeated.

The second pixel PXij includes a light-emitting element OLED, first to seventh transistors T1 to T7, and a storage capacitor Cst. The light-emitting element OLED may be an organic light-emitting diode including an anode and a cathode. The cathode may be a common electrode to which the second driving voltage ELVSS is applied. For convenience of illustration, the light-emitting element OLED is omitted in FIG. 3B.

The first transistor T1 may be a driving transistor in which a value of a drain current is determined according to a gate-source voltage thereof. The second to seventh transistors T2 to T7 may each be a switching transistor that is turned on/off according to a gate-source voltage thereof, or in other words, substantially according to a gate voltage thereof. The first to seventh transistors T1 to T7 may each be a thin film transistor.

The first transistor T1 may be referred to as a driving transistor, the second transistor T2 may be referred to as a scan transistor, the third transistor T3 may be referred to as a compensation transistor, the fourth transistor T4 may be referred to as a gate initialization transistor, the fifth transistor T5 may be referred to as a first emission control transistor, the sixth transistor T6 may be referred to as a second emission control transistor, and the seventh transistor T7 may be referred to as an anode initialization transistor.

The storage capacitor Cst is connected between the power line PL and a gate of the driving transistor T1. The storage capacitor Cst may include an upper electrode CE2 connected to the power line PL, and a lower electrode CE1 connected to the gate of the driving transistor T1. For example, as illustrated in FIGS. 3A and 3B, the storage capacitor Cst is connected between a horizontal power line PLh of the power line PL and the gate of the driving transistor T1. The storage capacitor Cst may include the upper electrode CE2 connected to the horizontal power line PLh of the power line PL, and the lower electrode CE1 connected to the gate of the driving transistor T1.

The driving transistor T1 may control a value of a current Id flowing from the power line PL to the light-emitting element OLED, according to the gate-source voltage thereof. The driving transistor T1 may include the gate connected to the lower electrode CE1 of the storage capacitor Cst, a source connected to the power line PL through the first emission control transistor T5, and a drain connected to the light-emitting element OLED through the second emission control transistor T6.

The driving transistor T1 may output the driving current Id to the light-emitting element OLED according to the gate-source voltage thereof. The value of the driving current Id is determined based on a difference between the gate-source voltage of the driving transistor T1 and a threshold voltage. The light-emitting element OLED may receive the driving current Id from the driving transistor T1, and may emit light having a brightness corresponding to the value of the driving current Id.

The scan transistor T2 may be configured to deliver the data voltage Dm_j to the driving transistor T1 in response to the first scan signal GW_i. The scan transistor T2 may include a gate connected to the first scan line GWL_i, a source connected to the data line GL_j, and a drain connected to the source of the driving transistor T1.

First and second compensation transistors T3a and T3b of the third transistor T3 are connected in series between the drain and the gate of the driving transistor T1, and connect the drain and the gate of the driving transistor T1 to each other in response to the first scan signal GW_i to diode-connect the driving transistor T1. The first compensation transistor T3a may include a gate connected to the first scan line GWL_i, a source connected to the drain of the driving transistor T1, and a drain connected to a source of the second compensation transistor T3b. The second compensation transistor T3b may include a gate connected to the first scan line GWL_i, a source connected to the drain of the first compensation transistor T3a, and a drain connected to the gate of the driving transistor T1. For example, as illustrated in FIG. 3B, the drain of the second compensation transistor T3b may be connected to the gate of the driving transistor T1 through a connection pattern CLP, a $(7-1)^{st}$ contact plug CP7a, and a $(7-2)^{nd}$ contact plug CP7b.

FIGS. 3A and 3B illustrate that the compensation transistor T3 includes two transistors T3a and T3b connected to each other in series, but the present disclosure is not limited thereto, and the compensation transistor T3 may include one transistor. As another example, the compensation transistor T3 may include three or more transistors that are connected to each other in series.

The gate initialization transistor T4 may apply the first initialization voltage VINT1 to the gate of the driving transistor T1 in response to the second scan signal GI_i. The gate initialization transistor T4 may include a gate connected to the second scan line GIL_i, a source connected to the gate of the driving transistor T1, and a drain connected to the first voltage line VL1.

As illustrated in FIGS. 3A and 3B, the gate initialization transistor T4 may include a first gate initialization transistor T4a and a second gate initialization transistor T4b that are connected to each other in series between the gate of the driving transistor T1 and the first voltage line VL1. The first gate initialization transistor T4a may include a gate connected to the second scan line GIL_i, a source connected to the gate of the driving transistor T1, and a drain connected to a source of the second gate initialization transistor T4b. The second gate initialization transistor T4b may include a gate connected to the second scan line GIL_i, a source connected to the drain of the first gate initialization transistor T4a, and a drain connected to the first voltage line VL1.

FIGS. 3A and 3B illustrate that the gate initialization transistor T4 includes two transistors T4a and T4b that are connected to each other in series, but the present disclosure is not limited thereto, and the gate initialization transistor T4 may include three or more transistors that are connected to each other in series. As another example, the gate initialization transistor T4 may include one transistor.

In an embodiment, as illustrated in FIG. 3B, a shield electrode Esh may be arranged between the first scan line GWL_i and the second scan line GIL_i. The shield electrode Esh may be connected to the first vertical power line PLv1 or the second vertical power line PLv2 through a fourteenth contact plug CP14. The shield electrode Esh may shield conductive layers (or metal layers) that are adjacent to each other, and may prevent or reduce the generation of unnecessary capacitors.

The anode initialization transistor T7 may apply the second initialization voltage VINT2 to the anode of the light-emitting element OLED, in response to the third scan signal GB_i. The anode initialization transistor T7 may include a gate connected to the third scan line GBL_i, a source connected to the anode of the light-emitting element OLED, and a drain connected to the second voltage line VL2.

The second pixel PXij and the third pixel PXi(j+1) may share the third contact plug CP3 connected to the second voltage line VL2. The second pixel PXij and the third pixel PXi(j+1) may share the third contact plug CP3 connected to the second vertical line VL2v of the second voltage line VL2. When the anode initialization transistor T7 of each of the second pixel PXij and the third pixel PXi(j+1) is turned on in response to the third scan signal GB_i, the second initialization voltage VINT2, which is transmitted through the third contact plug CP3, may be applied to the anode of the light-emitting element OLED of each of the second pixel PXij and the third pixel PXi(j+1).

The first emission control transistor T5 may connect the power line PL to the source of the driving transistor T1 in response to the emission control signal EM_i. The first emission control transistor T5 may include a gate connected to the emission control line EML_i, a source connected to the power line PL, and a drain connected to the source of the driving transistor T1.

The second emission control transistor T6 may connect the drain of the driving transistor T1 to the anode of the light-emitting element OLED in response to the emission control signal EM_i. The second emission control transistor T6 may include a gate connected to the emission control line EML_i, a source connected to the drain of the driving transistor T1, and a drain connected to the anode of the light-emitting element OLED. For example, as illustrated in FIG. 3B, the drain of the second emission control transistor T6 may be connected to the anode of the light-emitting element OLED through the connection line CML, a fifteenth contact plug CP15, and a sixteenth contact plug CP16.

The second scan signal GI_i may be synchronized or substantially synchronized with a first scan signal GW_i−1 of a previous row. The third scan signal GB_i may be synchronized or substantially synchronized with the first scan signal GW_i. According to another example, the third scan signal GB_i may be synchronized or substantially synchronized with a first scan signal GW_i+1 of a next row.

Hereinafter, processes of driving one pixel of an organic light-emitting display apparatus will be described in more detail.

When an emission control signal EM_i having a high level is received, the first emission control transistor T5 and the second emission control transistor T6 are turned off, the driving transistor T1 stops outputting the driving current Id, and the light-emitting element OLED stops emitting light.

Then, during a gate initialization period in which a second scan signal GI_i having a low level is received, the gate initialization transistor T4 is turned on, and the first initialization voltage VINT1 is applied to the gate of the driving transistor T1, or in other words, to a lower electrode of the storage capacitor Cst. In the storage capacitor Cst, a difference ELVDD−VINT1 between the first driving voltage ELVDD and the first initialization voltage VINT1 is stored.

Then, during a data write period in which a first scan signal GW_i having a low level is received, the scan transistor T2 and the compensation transistor T3 are turned on, and the data voltage Dm_j is received through the source of the driving transistor T1. The driving transistor T1 is diode-connected through the compensation transistor T3, and is biased in a forward direction. A gate voltage of the driving transistor T1 increases from the first initialization voltage VINT1. When the gate voltage of the driving transistor T1 becomes equal to or substantially equal to a data compensation voltage Dm_j−|Vth|, which is obtained by subtracting a threshold voltage Vth of the driving transistor T1 from the data voltage Dm_j, the driving transistor T1 is turned off, and an increase in the gate voltage of the driving transistor T1 stops. Accordingly, in the storage capacitor Cst, a difference ELVDD−Dm_j+|Vth| between the first driving voltage ELVDD and the data compensation voltage Dm_j−|Vth| is stored.

Also, during the anode initialization period in which a third scan signal GB_i having a low level is received, the anode initialization transistor T7 is turned on, and the second initialization voltage VINT2 is applied to the anode of the light-emitting element OLED. By applying the second initialization voltage VINT2 to the anode of the light-emitting element OLED, the light-emitting element OLED becomes completely non-emissive, and thus, subtle emission of the light-emitting element OLED according to a black gradation of a next frame may be removed (e.g., may be prevented or substantially prevented).

A level of the second initialization voltage VINT2 may be higher than a level of the first initialization voltage VINT1, and may be lower than a level of a portion of the second driving voltage ELVSS that is as high as the threshold voltage of the light-emitting element OLED. Because the light-emitting element OLED has a relatively large size, the light-emitting element OLED may significantly have a great capacitance. Furthermore, because the level of the first initialization voltage VINT1 is too low, the light-emitting element OLED may start to emit light in a next frame after a considerable delay. However, according to one or more embodiments of the present disclosure, the anode of the light-emitting element OLED is initialized according to the second initialization voltage VINT2 having a higher level than that of the first initialization voltage VINT1, and thus, the light-emitting element OLED may start emitting light faster in a next frame. In other words, an emission delay may be reduced.

The first scan signal GW_i may be synchronized or substantially synchronized with the third scan signal GB_i, and in this case, the data write period may be the same or substantially the same as the anode initialization period.

Then, when the emission control signal EM_i having a low level is received, the first emission control transistor T5 and the second emission control transistor T6 may be turned on, and the driving transistor T1 may output a driving current Id corresponding to a voltage ELVDD−Dm_j, which is obtained by subtracting the threshold voltage |Vth| of the driving transistor T1 from the voltage stored in the storage capacitor Cst, or in other words, a source-gate voltage ELVDD−Dm_j+|Vth| of the driving transistor T1. The light-emitting element OLED may emit light having a brightness corresponding to a value of the driving current Id.

FIG. 4 illustrates a semiconductor pattern according to an embodiment.

Referring to FIG. 4, a display apparatus may include a semiconductor pattern Act.

The semiconductor pattern Act may extend (e.g., may continuously extend) in the second direction DR2. The semiconductor pattern Act may be integrally formed by extending in the second direction DR2 without any disconnection therein. The semiconductor pattern Act of FIG. 4 may partially extend in the first direction DR1, but may generally extend in the second direction DR2 overall. In other words, the semiconductor pattern Act includes a portion microscopically extending in the first direction DR1, but may generally extend in the second direction DR2 overall.

The semiconductor pattern Act may include pixel areas Ai(j−1), Aij, and Ai(j+1), connection areas Aca arranged between the pixel areas Ai(j−1), Aij, and Ai(j+1), and contact areas Acp.

Figure 6:
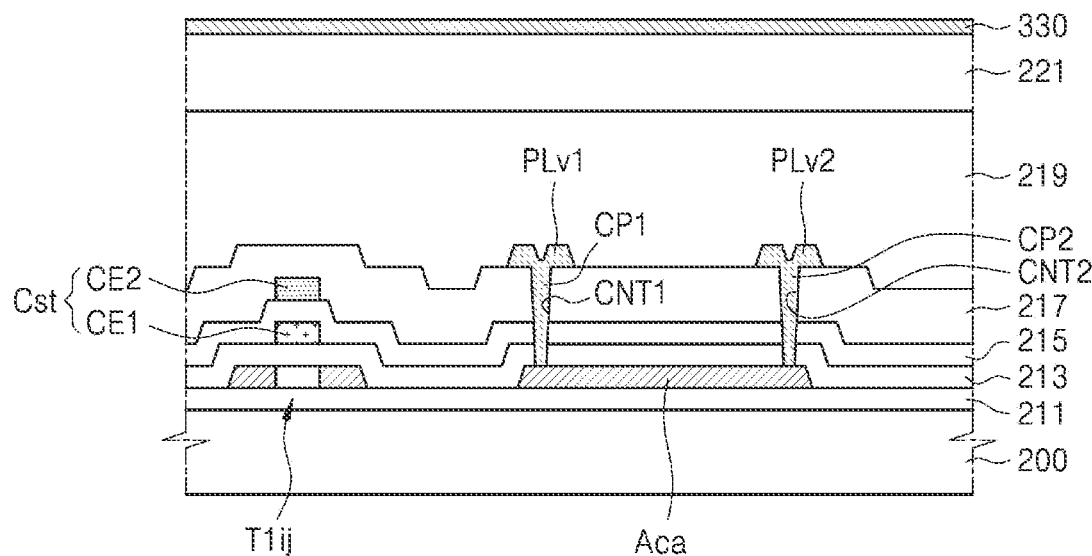
FIG. 6 is a schematic cross-sectional view of a portion of a display apparatus according to an embodiment.

The pixel areas Ai(j−1), Aij, and Ai(j+1) may be included in the first to third pixels PXi(j−1), PXij, PXi(j+1), respectively. The connection areas Aca may correspond to the first contact plugs CP1 and the second contact plugs CP2, and the contact areas Acp may correspond to the third contact plugs CP3, respectively. As another example, as illustrated in FIGS. 5 and 6, the connection areas Aca may contact (e.g., may directly contact) the first contact plugs CP1 and the second contact plugs CP2, and the contact areas Acp may contact (e.g., may directly contact) the third contact plugs CP3, respectively.

Also, as illustrated in FIG. 3A, the connection areas Aca may connect the first vertical power lines PLv1 to the second vertical power lines PLv2.

In an embodiment, the connection areas Aca and the contact areas Acp may be alternately arranged along the second direction DR2.

For example, the connection area Aca may connect the pixel area Ai(j−1) of the first pixel PXi(j−1) to the pixel area Aij of the second pixel PXij, and the contact area Acp may connect the pixel area Aij of the second pixel PXij to the pixel area Ai(j+1) of the third pixel PXi(j+1). Although not completely shown in FIG. 4, the pixel area Ai(j−1) of the first pixel PXi(j−1) may be connected through a contact area Acp to a pixel area of a pixel arranged in a previous column, and the pixel area Ai(j+1) of the third pixel PXi(j+1) may be connected through a connection area Aca to a pixel area of a pixel arranged in a next column.

As a comparative example, a semiconductor pattern may not continuously extend in a row direction, and may include island patterns that are spaced apart (e.g., that are separated) from each other. In this case, the island patterns of each pixel may not be connected to each other. Static electricity may be generated (or introduced) from the outside while a subsequent process is performed after the semiconductor pattern is formed and the like. When the semiconductor pattern includes the island patterns that are spaced apart (e.g., that are separated) from each other, the generated (or introduced) static electricity may be isolated in each of the island patterns. Therefore, the semiconductor pattern affected through the static electricity may be damaged, and the pixels may become defective because of the damaged semiconductor pattern.

According to one or more embodiments of the present disclosure, however, when the semiconductor pattern Act continuously extends in the second direction DR2, the static electricity generated (or introduced) from the outside may not be isolated, and may be distributed (or moved) in the second direction DR2. Therefore, because the static electricity may not be isolated in the semiconductor pattern Act and may be distributed in the second direction DR2, the damage to the semiconductor pattern Act may be prevented or reduced.

FIG. 5 is a schematic cross-sectional view of a portion of a display apparatus according to an embodiment.

FIG. 5 schematically illustrates a portion of each of the first pixel PXi(j−1), the second pixel PXij, and the third pixel PXi(j+1) based on the illustrations of FIGS. 3A and 4, and thus, some components thereof may not be illustrated.

The first pixel PXi(j−1) may include a first emission control transistor T5i(j−1). The second pixel PXij may include a driving transistor T1ij, a first emission control transistor T5ij, and an anode initialization transistor T7ij. The third pixel PXi(j+1) may include an anode initialization transistor T7i(j+1).

The first emission control transistor T5i(j−1) of the first pixel PXi(j−1) may include an active area A5i(j−1), and a gate electrode G. The active area A5i(j−1) of the first emission control transistor T5i(j−1) of the first pixel PXi(j−1) may correspond to a portion of the pixel area Ai(j−1) (e.g., see FIG. 4) of the first pixel PXi(j−1).

The driving transistor T1ij of the second pixel PXij may include an active area A1ij, and a gate electrode G. The first emission control transistor T5ij of the second pixel PXij may include an active area A5ij, and a gate electrode G. The anode initialization transistor T7ij of the second pixel PXij may include an active area A7ij, and a gate electrode G. The active area A1ij of the driving transistor T1ij of the second pixel PXij, the active area A5ij of the first emission control transistor T5ij of the second pixel PXij, and the active area A7ij of the anode initialization transistor T7ij of the second pixel PXij may correspond to portions of the pixel area Aij of the second pixel PXij, respectively.

The anode initialization transistor T7i(j+1) of the third pixel PXi(j+1) may include an active area A7i(j+1), and a gate electrode G. The active area A7i(j+1) of the anode initialization transistor T7i(j+1) of the third pixel PXi(j+1) may correspond to a portion of the pixel area Ai(j+1) (e.g., see FIG. 4) of the third pixel PXi(j+1).

The active area A5i(j−1) of the first emission control transistor T5i(j−1) of the first pixel PXi(j−1) may be connected to the connection area Aca, and may receive the first driving power ELVDD (e.g., see FIG. 3A) from the first vertical power line PLv1. The active area A5ij of the first emission control transistor T5ij of the second pixel PXij may be connected to the connection area Aca, and may receive the first driving power ELVDD from the second vertical power line PLv2.

The active area A5i(j−1) of the first emission control transistor T5i(j−1) of the first pixel PXi(j−1) and the active area A5ij of the first emission control transistor T5ij of the second pixel PXij may be connected to each other through the connection area Aca.

The active area A7ij of the anode initialization transistor T7ij of the second pixel PXij may be connected to the contact area Acp, and may receive the second initialization voltage VINT2 (e.g., see FIG. 3A) from the second voltage line VL2. The active area A7i(j+1) of the anode initialization transistor T7i(j+1)) of the third pixel PXi(j+1) may be connected to the contact area Acp, and may receive the second initialization voltage VINT2 from the second voltage line VL2.

The active area A7ij of the anode initialization transistor T7ij of the second pixel PXij may be connected to the active area A7i(j+1) of the anode initialization transistor T7i(j+1) of the third pixel PXi(j+1) through the contact area Acp.

Hereinafter, multilayered films and the like that are stacked in the display apparatus will be described in more detail with reference to FIG. 5.

A substrate 200 may include a glass material, a ceramic material, a metallic material, or a flexible and/or bendable material. When the substrate 200 includes a flexible and/or bendable material, the substrate 200 may include a polymer resin, for example, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 200 may have a single-layer structure or a multilayered structure including one or more of the above materials. When the substrate 200 has a multilayered structure, the substrate 200 may further include an inorganic layer. In some embodiments, the substrate 200 may have a structure of an organic material/an inorganic material/an organic material.

A buffer layer 211 may decrease or prevent the penetration of impurities, moisture, and/or external air from a rear (e.g., the bottom) of the substrate 200, and may provide a planar or substantially planar surface to the substrate 200. The buffer layer 211 may include an inorganic material, for example, such as an oxide or a nitride, an organic material, or a composite of organic/inorganic materials, and may have a single-layer structure or a multilayered structure including one or more organic and inorganic materials.

In some embodiments, a barrier layer may be further included between the substrate 200 and the buffer layer 211. The barrier layer may prevent or decrease the penetration of the impurities from the substrate 200 and/or the like, into the active areas A5i(j−1), A1ij, A5ij, A7ij, and A7i(j+1), the connection area Aca, and the contact area Acp. The barrier layer may include an inorganic material, for example, such as an oxide or a nitride, an organic material, or a composite of organic/inorganic materials, and may have a single-layer structure or a multilayered structure including one or more organic and inorganic materials.

On the buffer layer 211, the active areas A5i(j−1), A1ij, A5ij, A7ij, and A7i(j+1), the connection area Aca, and the contact area Acp may be arranged. The active areas A5i(j−1), A1ij, A5ij, A7ij, and A7i(j+1), the connection area Aca, and the contact area Acp may each include amorphous silicon or polysilicon.

In another embodiment, the active areas A5i(j−1), A1ij, A5ij, A7ij, and A7i(j+1), the connection area Aca, and the contact area Acp may each include an oxide semiconductor material. The active areas A5i(j−1), A1ij, A5ij, A7ij, and A7i(j+1), the connection area Aca, and the contact area Acp may each include, for example, at least one oxide selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the active areas A5i(j−1), A1ij, A5ij, A7ij, and A7i(j+1), the connection area Aca, and the contact area Acp may be an InSnZnO (ITZO) semiconductor layer, an InGaZnO (IGZO) semiconductor layer, and/or the like. Because an oxide semiconductor has a wide bandgap (e.g., about 3.1 eV), high carrier mobility, and a low leakage current, a voltage drop may not be great despite a long driving time, and thus, when the oxide semiconductor is driven in a low frequency, the luminance of the oxide semiconductor may not be greatly change according to the voltage drop.

Each of the active areas A5i(j−1), A1ij, A5ij, A7ij, and A7i(j+1) may include a channel area, and source and drain areas located at (e.g., in or on) opposite sides of the channel area. Each of the active areas A5i(j−1), A1ij, A5ij, A7ij, and A7i(j+1) may be a single layer or multiple layers.

On the substrate 200, a first gate insulating layer 213 and a second gate insulating layer 215 may be stacked to cover the active areas A5i(j−1), A1ij, A5ij, A7ij, and A7i(j+1), the connection area Aca, and the contact area Acp. The first gate insulating layer 213 and the second gate insulating layer 215 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. Zinc oxide ($ZnO_x$) may be ZnO, and/or $ZnO_2$.

The gate electrodes G may be arranged on the first gate insulating layer 213. Each gate electrode G may include a conductive material including, for example, molybdenum (Mo), aluminum (Al), copper (Cu), titanium (Ti), or the like, and may be a single layer or multiple layers including one or more of the above materials. For example, each gate electrode G may have a multilayered structure of Ti/Al/Ti.

The gate electrodes G may overlap with at least a part of the active areas A5i(j−1), A1ij, A5ij, A7ij, and A7i(j+1), respectively. For example, the gate electrodes G may overlap with the active areas A5i(j−1), A1ij, A5ij, A7ij, and A7i(j+1), respectively.

In an embodiment, the storage capacitor Cst may include the lower electrode CE1 and the upper electrode CE2. As illustrated in FIG. 5, in some embodiments, the storage capacitor Cst may overlap with the driving transistor T1ij. For example, the gate electrode G of the driving transistor T1ij may function as the lower electrode CE1 of the storage capacitor Cst. As another example, the storage capacitor Cst may not overlap with the driving transistor T1ij, and may be spaced apart (e.g., may be separated) from the driving transistor T1ij.

The upper electrode CE2 of the storage capacitor Cst may overlap with the lower electrode CE1 of the storage capacitor Cst with the second gate insulating layer 215 therebetween, and may form a capacitance with the lower electrode CE1. In this case, the second gate insulating layer 215 may function as a dielectric layer of the storage capacitor Cst. The upper electrode CE2 of the storage capacitor Cst may include a conductive material including, for example, Mo, Al, Cu, TI, or the like, and may be a single layer or multiple layers including one or more of the above materials. For example, the upper electrode CE2 of the storage capacitor Cst may have a multilayered structure of Ti/Al/Ti.

On the second gate insulating layer 215, an interlayer insulating layer 217 may be arranged to cover the upper electrode CE2 of the storage capacitor Cst. The interlayer insulating layer 217 may include SiO$_2$, SiN$_x$, SiON, Al$_2$O$_3$, TiO$_2$, Ta$_2$O$_5$, HfO$_2$, ZnO$_x$, or the like.

A conductive layer may be arranged on the interlayer insulating layer 217. The conductive layer may include a conductive material including, for example, Mo, Al, Cu, TI, or the like, and may be a single layer or multiple layers including one or more of the above materials. For example, the conductive layer may have a multilayered structure of Ti/Al/Ti.

The conductive layer may include a connection line CML, the first vertical power line PLv1, the second vertical power line PLv2, and the second voltage line VL2.

The connection line CML, the first vertical power line PLv1, the second vertical power line PLv2, and the second voltage line VL2 may be connected to the active areas A5i(j−1), A1ij, A5ij, A7ij, and A7i(j+1), the connection area Aca, and the contact area Acp through contact holes formed in insulating layers.

For example, the connection line CML may be connected to the anode initialization transistor T7ij of the first pixel PXij through a contact hole formed in the first gate insulating layer 213, the second gate insulating layer 215, and the interlayer insulating layer 217. Part of the connection line CML may be buried in (e.g., may extend through) the contact hole, and the buried part (e.g., a penetrating part) of the connection line CML may be referred to as the fifteenth contact plug CP15.

A pixel electrode 310 of the light-emitting element 300 may be connected to the connection line CML through a contact hole formed in a planarization layer 219. Part of the pixel electrode 310 may be buried in (e.g., may extend through) the contact hole, and the buried part (e.g., a penetrating part) of the pixel electrode 310 may be referred to as the sixteenth contact plug CP16. Because the pixel electrode 310 is connected to the connection line CML, and the connection line CML is connected to the anode initialization transistor T7ij of the second pixel PXij, the connection line CML may connect the light-emitting element 300 to the anode initialization transistor T7ij of the second pixel PXij.

The first vertical power line PLv1 may be connected to the connection area Aca through a first contact hole CNT1 formed in the first gate insulating layer 213, the second gate insulating layer 215, and the interlayer insulating layer 217. Part of the first vertical power line PLv1 may be buried in (e.g., may extend through) the first contact hole CNT1, and the buried part (e.g., a penetrating part) of the first vertical power line PLv1 may be referred to as the first contact plug CP1. In other words, the first vertical power line PLv1 may be integrally formed with the first contact plug CP1.

The second first vertical power line PLv2 may be connected to the connection area Aca through a second contact hole CNT2 formed in the first gate insulating layer 213, the second gate insulating layer 215, and the interlayer insulating layer 217. Part of the second vertical power line PLv2 may be buried in (e.g., may extend through) the second contact hole CNT2, and the buried part (e.g., a penetrating part) of the second vertical power line PLv2 may be referred to as the second contact plug CP2. In other words, the second vertical power line PLv2 may be integrally formed with the second contact plug CP2.

The second voltage line VL2 may be connected to the contact area Acp through a third contact hole CNT3 formed in the first gate insulating layer 213, the second gate insulating layer 215, and the interlayer insulating layer 217. Part of the second voltage line VL2 may be buried in (e.g., may extend through) the third contact hole CNT3, and the buried part (e.g., a penetrating part) of the second voltage line VL2 may be referred to as the third contact plug CP3. In other words, the second voltage line VL2 may be integrally formed with the third contact plug CP3.

In some embodiments, the conductive layer may be covered by an inorganic protection layer. The inorganic protection layer may be a single layer or multiple layers including SiN$_x$ and/or SiO$_x$. The inorganic protection layer may be introduced to cover and protect some lines arranged on the interlayer insulating layer 217.

The planarization layer 219 may be arranged on the interlayer insulating layer 217, and the light-emitting element 300 may be arranged on the planarization layer 219.

The planarization layer 219 may be a single layer or multiple layers including one or more organic materials, and may provide a flat or substantially flat upper surface. The planarization layer 219 may include a general-purpose polymer, for example, such as benzocyclobutene (BCB), polyimide, hexamethyldisiloxane (HMDSO), polymethylmethacrylate (PMMA), or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and/or a blend thereof.

The light-emitting element 300 may be arranged on the planarization layer 219. The light-emitting element 300 may include the pixel electrode 310, an intermediate layer 320 including an organic emission layer, and an opposite electrode 330.

The pixel electrode 310 may be a light-transmissive or semi-transmissive electrode, or a reflection electrode. In some embodiments, the pixel electrode 310 may include a reflection layer including Ag, Mg, Al, Pt, Pd, Au, Ni, Nd, Ir, Cr, and/or a combination thereof, and a transparent or translucent electrode layer formed on the reflection layer. The transparent or translucent electrode layer may include at least one material selected from the group consisting of indium tin oxide (ITO), indium zinc oxide (IZO), zinc oxide (ZnO$_x$), indium oxide (In$_2$O$_3$), indium gallium oxide (IGO), and aluminum zinc oxide (AZO). In some embodiments, the pixel electrode 310 may include ITO/Ag/ITO.

A pixel-defining layer 221 may be arranged on the planarization layer 219. The pixel-defining layer 221 may prevent or substantially prevent arcs and/or the like from being generated at edges of the pixel electrode 310 by increasing a distance between the edges of the pixel electrode 310 and the opposite electrode 330 above the pixel electrode 310.

The pixel-defining layer 221 may include at least one organic insulating material selected from the group consisting of polyimide, polyamide, acryl resin, BCB, and phenol resin.

The intermediate layer 320 may be located in an opening formed through the pixel-defining layer 221. The intermediate layer 320 may include the organic emission layer. The organic emission layer may include an organic material including a fluorescent or phosphorescent material for emitting red light, green light, blue light, or white light. The organic emission layer may include a low-molecular weight organic material or a high-molecular weight organic material, and a functional layer, for example, such as a hole transport layer (HTL), a hole injection layer (HIL), an electron transport layer (ETL), or an electron injection layer (EIL), may be selectively disposed on and/or under (e.g., underneath) the organic emission layer.

The intermediate layer 320 may be individually disposed to corresponding to each of the pixel electrodes 310. However, the present disclosure is not limited thereto, and various modifications may be made to the intermediate layer 320. For example, the intermediate layer 320 may include a layer that is integrally formed over the pixel electrodes 310.

The opposite electrode 330 may be a light-transmissive electrode or a reflection electrode. In some embodiments, the opposite electrode 330 may be transparent or translucent, and may be a metallic thin film having a low work function including, for example, Li, Ca, LiF/Ca, LiF/Al, Al, Ag, Mg, and/or a combination thereof. A transparent conductive oxide (TCO) film, for example, such as ITO, IZO, $ZnO_x$, or $In_2O_3$, may be further disposed on the metallic thin film. The opposite electrode 330 may be disposed over the display, and on upper portions of the intermediate layer 320 and the pixel-defining layer 221. The opposite electrode 330 may be integrally formed (e.g., commonly formed) for the light-emitting elements 300, and may correspond to the pixel electrodes 310.

In some embodiments, the light-emitting element 300 may be covered by an encapsulation layer. The encapsulation layer may include at least one organic encapsulation layer and at least one inorganic encapsulation layer.

The inorganic encapsulation layer may include at least one inorganic material selected from among $Al_2O_3$, $TiO_2$, $Ta_2O_5$, $HfO_2$, $ZnO_x$, $SiO_2$, $SiN_x$, and/or SiON. A first inorganic encapsulation layer and a second inorganic encapsulation layer may each be a single layer or multiple layers including one or more of the above materials. An organic encapsulation layer may include a polymer-based material. The polymer-based material may include an acryl-based resin, for example, such as polymethyl methacrylate (PMMA) or polyacrylic acid, an epoxy-based resin, polyimide, polyethylene, and/or the like. In an embodiment, the organic encapsulation layer may include acrylate polymer.

FIG. 6 is a schematic cross-sectional view of a portion of a display apparatus according to an embodiment.

Referring to FIG. 6, insulating layers, for example, such as the first gate insulating layer 213, the second gate insulating layer 215, and the interlayer insulating layer 217, may be disposed between the connection area Aca of the semiconductor pattern Act (e.g., see FIG. 4) and the first and second vertical power lines PLv1 and PLv2.

The first vertical power line PLv1 may be connected to an end portion of the connection area Aca of the semiconductor pattern Act through the first contact hole CNT1 formed in the first gate insulating layer 213, the second gate insulating layer 215, and the interlayer insulating layer 217. Part of the first vertical power line PLv1 may be buried in (e.g., may extend through) the first contact hole CNT1, and the buried part (e.g., the penetrating part) of the first vertical power line PLv1 may be referred to as the first contact plug CP1. In other words, the first contact plug CP1 may penetrate the insulating layers, and may connect the first vertical power line PLv1 to an end portion of the connection area Aca of the semiconductor pattern Act.

The second vertical power line PLv2 may be connected to another end portion of the connection area Aca of the semiconductor pattern Act through the second contact hole CNT2 formed in the first gate insulating layer 213, the second gate insulating layer 215, and the interlayer insulating layer 217. Part of the second vertical power line PLv2 may be buried in (e.g., may extend through) the second contact hole CNT2, and the buried part (e.g., the penetrating part) of the second vertical power line PLv2 may be referred to as the second contact plug CP2. In other words, the second contact plug CP2 may penetrate the insulating layers, and may connect the second vertical power line PLv2 to the other end of the connection area Aca of the semiconductor patter Act.

The first vertical power line PLv1 and the second vertical power line PLv2 may be connected to each other through the connection area Aca of the semiconductor pattern Act.

Figure 7:
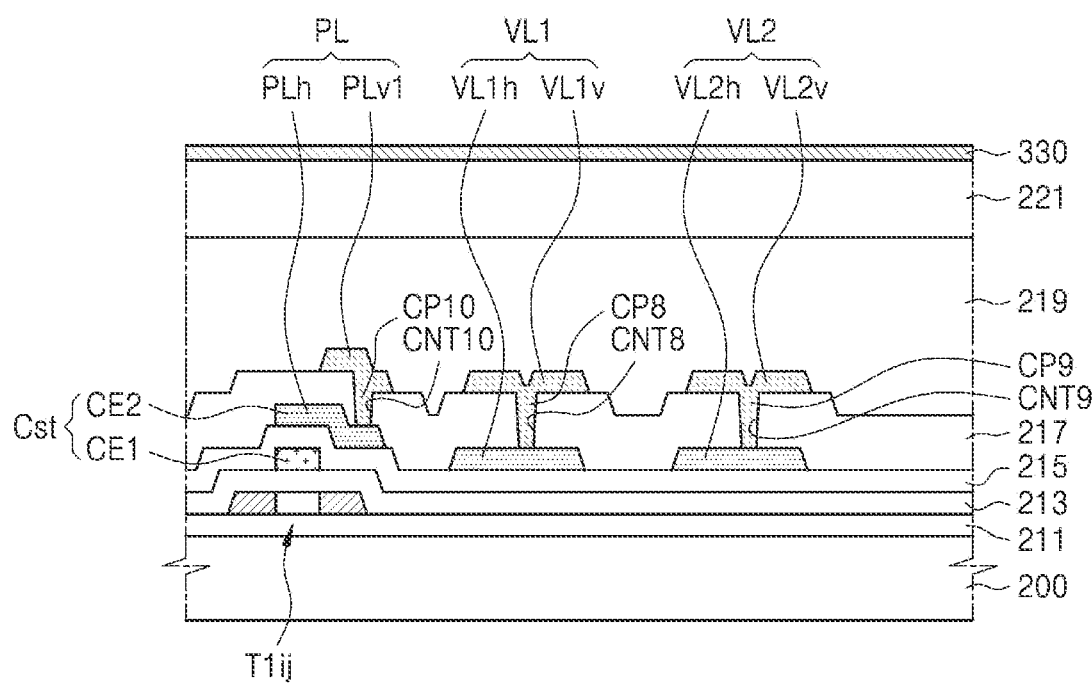
FIG. 7 is a schematic cross-sectional view of a portion of a display apparatus according to an embodiment.

FIG. 7 is a schematic cross-sectional view of a portion of a display apparatus according to an embodiment.

Referring to FIG. 7, the first voltage line VL1 may include a first vertical line VL1v and a first horizontal line VL1h. The second voltage line VL2 may include a second vertical line VL2v and a second horizontal line VL2h. The power line PL may include the first vertical power line PLv1 and a horizontal power line PLh. As described above with reference to FIG. 3A, the power line PL may include the second vertical power line PLv2. The first vertical power line PLv1 is mainly described with reference to FIG. 7, but the second vertical power line PLv2 may have the same or substantially the same structure as that of the first vertical power line PLv1, and thus, redundant description thereof may not be repeated.

The interlayer insulating layer 217 may be arranged between the first vertical line VL1v and the first horizontal line VL1h. The first vertical line VL1v may be connected to the first horizontal line VL1h through the eighth contact hole CNT8 formed in the interlayer insulating layer 217. Part of the first vertical line VL1v may be buried in (e.g., may extend through) the eighth contact hole CNT8, and the buried part (e.g., the penetrating part) of the first vertical line VL1v may be referred to as the eighth contact plug CP8. In other words, the eighth contact plug CP8 may penetrate the insulating layer, and may connect the first vertical line VL1v to the first horizontal line VL1h.

The interlayer insulating layer 217 may be arranged between the second vertical line VL2v and the second horizontal line VL2h. The second vertical line VL2v may be connected to the second horizontal line VL2h through the ninth contact hole CNT9 formed in the interlayer insulating layer 217. Part of the second vertical line VL2v may be buried in (e.g., may extend through) the ninth contact hole CNT9, and the buried part (e.g., the penetrating part) of the second vertical line VL2v may be referred to as the ninth contact plug CP9. In other words, the ninth contact plug CP9 may penetrate the insulating layer, and may connect the second vertical line VL2v to the second horizontal line VL2h.

The interlayer insulating layer 217 may be arranged between the first vertical power line PLv1 and the horizontal power line PLh. The first vertical power line PLv1 may be connected to the horizontal power line PLh through the tenth contact hole CNT10 formed in the interlayer insulating layer 217. Part of the first vertical power line PLv1 may be buried in (e.g., may extend through) the tenth contact hole CNT10, and the buried part (e.g., the penetrating part) of the first vertical power line PLv1 may be referred to as the tenth contact plug CP10. In other words, the tenth contact plug CP10 may penetrate the insulating layer, and may connect the first vertical power line PLv1 to the horizontal power line PLh.

FIG. 7 illustrates that the horizontal power line PLh may be arranged on the second gate insulating layer 215, and the first vertical power line PLv1 may be arranged on the interlayer insulating layer 217, but the present disclosure is not limited thereto. In another embodiment, the horizontal power line PLh may be arranged on the interlayer insulating layer 217, and the first vertical power line PLv1 may be arranged on the second gate insulating layer 215. As another example, the horizontal power line PLh may be arranged on the first gate insulating layer 213.

As another example, the horizontal power line PLh and the first vertical power line PLv1 may be at (e.g., in or on) the same layer as each other. In other words, the horizontal power line PLh may contact (e.g., may directly contact) the first vertical power line PLv1. In this case, the tenth contact plug CP10 may correspond to a portion where the horizontal power line PLh may contact (e.g., may directly contact) the first vertical power line PLv1. In other words, the tenth contact plug CP10 may correspond to a portion where the horizontal power line PLh may cross the first vertical power line PLv1.

The horizontal power line PLh and the first vertical power line PLv1 are mainly described in more detail, but the first vertical line VL1v and the first horizontal line VL1h and/or the second vertical line VL2v and the second horizontal line VL2h may have the same or substantially the same structure as those of the horizontal power line PLh and the first vertical power line PLv1 described above, and thus, redundant description thereof may not be repeated.

FIG. 8 is an equivalent circuit diagram of a plurality of pixels according to another embodiment.

FIG. 8 illustrates the first pixel PXi(j−1), the second pixel PXij, and the third pixel PXi(j+1) in more detail. Because the first pixel PXi(j−1), the second pixel PXij, and the third pixel PXi(j+1) are arranged in the same row as each other, the first pixel PXi(j−1), the second pixel PXij, and the third pixel PXi(j+1) may each be connected to the first to third scan lines GWL_i, GIL_i, and GBL_i, and the emission control line EML_i. The first pixel PXi(j−1), the second pixel PXij, and the third pixel PXi(j+1) may be sequentially arranged along the second direction DR2, and may be adjacent to one another.

In an embodiment, the first pixel PXi(j−1) and the second pixel PXij, which are selected from among the first pixel PXi(j−1), the second pixel PXij, and the third pixel PXi(j+1) that are sequentially arranged along the second direction DR2, may share a first contact plug CP1', and the second pixel PXij and the third pixel PXi(j+1) may share a second contact plug CP2'.

The first contact plug CP1' may be connected to a power line PL through which a first driving voltage ELVDD is applied, and the second contact plug CP2' may be connected to a second voltage line VL2 through which a second initialization voltage VINT2 is applied.

Because the first pixel PXi(j−1) and the second pixel PXij share the first contact plug CP1', the first pixel PXi(j−1) and the second pixel PXij may be connected to the power line PL through the first contact plug CP1'. Because the second pixel PXij and the third pixel PXi(j+1) share the second contact plug CP2', the second pixel PXij and the third pixel PXi(j+1) may be connected to the second voltage line VL2 through the second contact plug CP2'.

In other words, the first contact plug CP1' may connect the first pixel PXi(j−1) and the second pixel PXij to the power line PL, and the second contact plug CP2' may connect the second pixel PXij and the third pixel PXi(j+1) to the second voltage line VL2.

Figure 10:
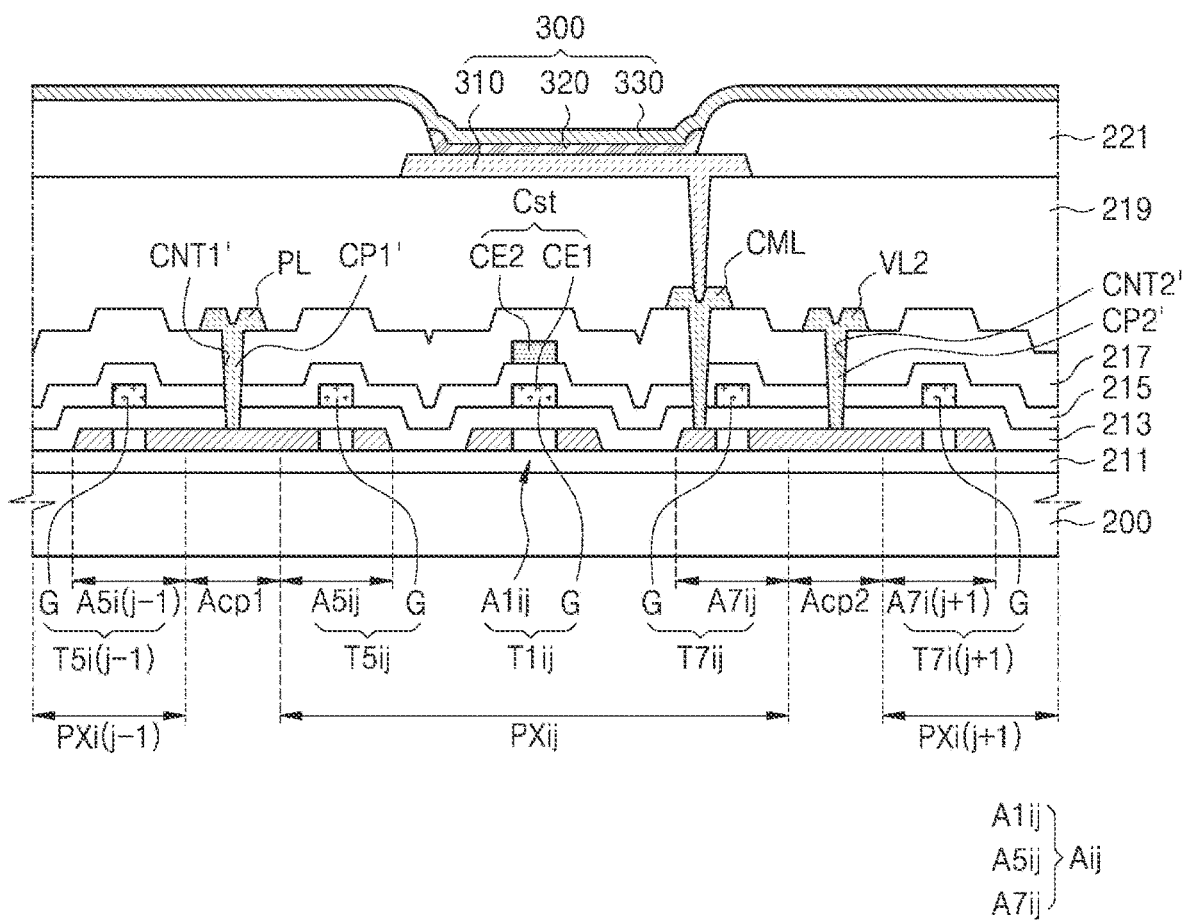
FIG. 10 is a schematic cross-sectional view of a portion of a display apparatus according to another embodiment.

As illustrated in FIG. 10, the first contact plug CP1' and the second contact plug CP2' may correspond to portions of a conductive layer. The first contact plug CP1' and the second contact plug CP2' may correspond to portions of the conductive layer buried in (e.g., extending through) contact holes formed in an insulating layer.

With respect to the second pixel PXij, the second pixel PXij may share the first contact plug CP1' with the first pixel PXi(j−1) arranged in the previous column, and may share the second contact plug CP2' with the third pixel PXi(j+1) arranged in the next column.

The first pixel PXi(j−1) may share the second contact plug CP2' with the third pixel PXi(j+1) arranged in a previous column. Also, the third pixel PXi(j+1) may share the first contact plug CP1' with the first pixel PXi(j−1) arranged in the next column.

In this case, with respect to the first pixel PXi(j−1) shown in FIG. 8, the first pixel PXi(j−1) may share the second contact plug CP2' with the third pixel PXi(j+1) arranged in the previous column, and may share the first contact plug CP1' with the second pixel PXij arranged in the next column. With respect to the third pixel PXi(j+1) shown in FIG. 8, the third pixel PXi(j+1)) may share the second contact plug CP2' with the second pixel PXij arranged in the previous column, and may share the first contact plug CP1' with the first pixel PXi(j−1) arranged in the next column.

In other words, the pixels arranged in the $i^{th}$ row may be connected to one another through the first contact plug CP1' and the second contact plug CP2' that are alternately arranged along the second direction DR2.

The same configurations as those of the pixels arranged in the $i^{th}$ row may be applied to pixels arranged in, for example, an $(i-1)^{th}$ row and an $(i+1)^{th}$ row. In this case, the first contact plugs CP1', the second contact plugs CP2', and the like may be arranged along the first direction DR1.

The power line PL may include the vertical power lines PLv and the horizontal power lines PLh. The vertical power lines PLv may each extend in the first direction DR1, and may be configured to deliver the first driving voltage ELVDD to the pixels arranged in the same column. The horizontal power lines PLh may each extend in the second direction DR2, and may be configured to deliver the first driving voltage EVLDD to the pixels arranged in the same row.

The horizontal power lines PLh may be connected to the vertical power lines PLv. For example, as illustrated in FIG. 8, the horizontal power lines PLh may be connected to the vertical power lines PLv through the twelfth contact plugs CP12.

In an embodiment, the first pixel PXi(j−1) and the second pixel PXij may share the power line PL. For example, as illustrated in FIG. 8, the first pixel PXi(j−1) and the second pixel PXij may share a corresponding one of the vertical power lines PLv of the power line PL. In this case, the number of vertical power lines PLv of the power line PL per unit area may be less than that of data lines per unit area.

In an embodiment, the second pixel PXij and the third pixel PXi(j+1) may share the second voltage line VL2. For example, as illustrated in FIG. 8, the second pixel PXij and the third pixel PXi(j+1) may share a corresponding one of the second vertical lines VL2v of the second voltage line VL2. In this case, the number of second vertical lines VL2v of the second voltage line VL2 per unit area may be less than that of the first vertical lines VL1v of the first voltage line VL1 per unit area.

In an embodiment, the vertical power lines PLv of the power line PL and the second vertical lines VL2v of the second voltage line VL2 may be alternately arranged along the second direction DR2.

Figure 9:
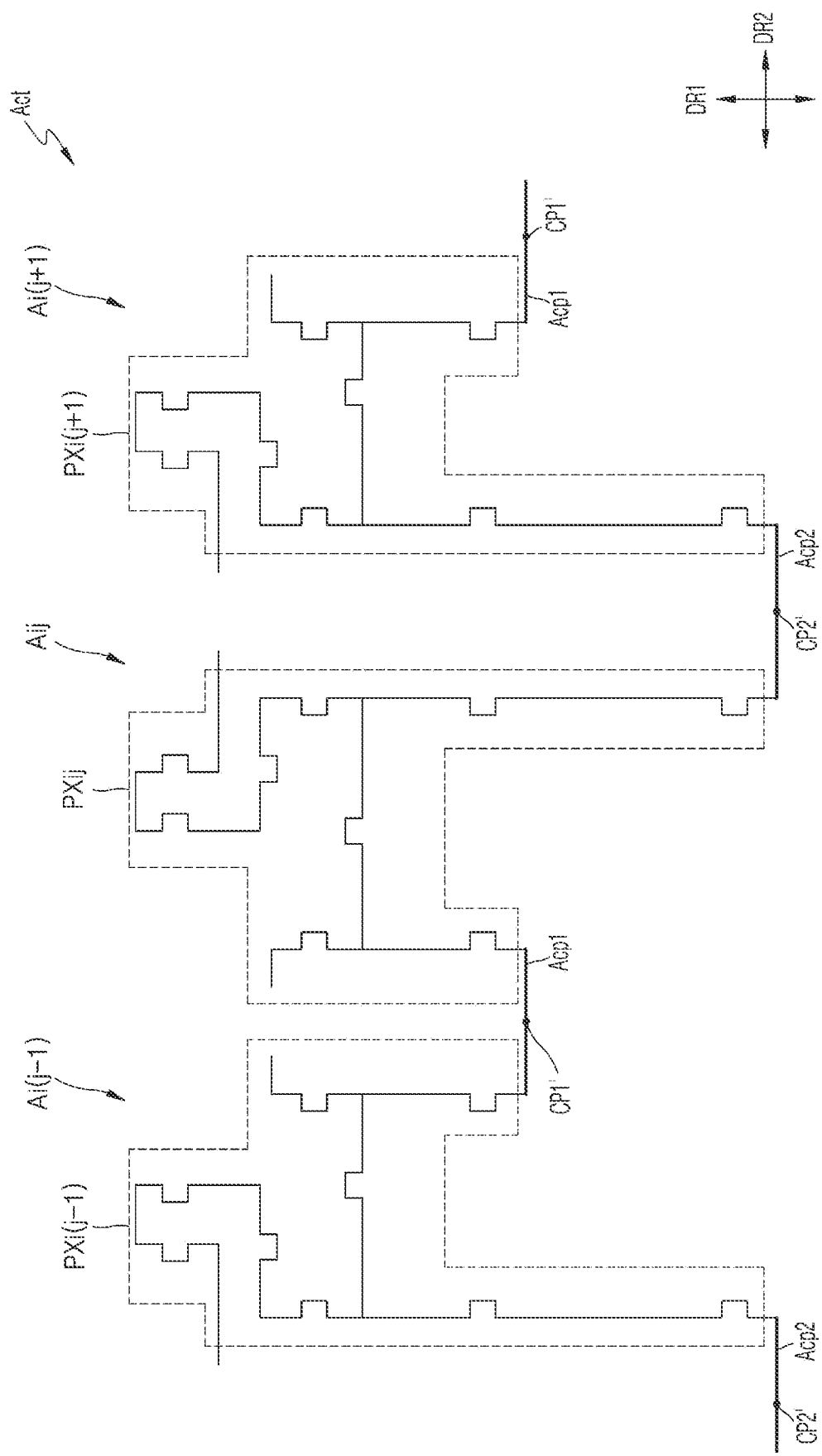
FIG. 9 illustrates a semiconductor pattern according to another embodiment.

FIG. 9 illustrates a semiconductor pattern according to another embodiment.

Referring to FIG. 9, a display apparatus may include the semiconductor pattern Act.

The semiconductor pattern Act may extend (e.g., may continuously extend) in the second direction DR2. The semiconductor pattern Act may be integrally formed in the second direction DR2 without any disconnection. The semiconductor pattern Act of FIG. 9 may partially extend in the first direction DR1, but may generally extend in the second direction DR2 overall. In other words, the semiconductor pattern Act may include a portion microscopically extending in the first direction DR1, but may extend in the second direction DR2 overall.

The semiconductor pattern Act may include pixel areas Ai(j−1), Aij, and Ai(j+1), and first contact areas Acp1 and second contact areas Acp2 arranged between the pixel areas Ai(j−1), Aij, and Ai(j+1).

The pixel areas Ai(j−1), Aij, and Ai(j+1) may be included in the first to third pixels PXi(j−1), PXij, and PXi(j+1), respectively. The first contact areas Acp1 may correspond to the first contact plugs CP1', respectively, and the second contact areas Acp2 may correspond to the second contact plugs CP2', respectively. As another example, as illustrated in FIG. 10, the first contact plugs CP1' may contact (e.g., may directly contact) the first contact plugs CP1', respectively, and the second contact areas Acp2 may contact (e.g., may directly contact) the second contact plugs CP2', respectively.

In an embodiment, the first contact areas Acp1 and the second contact areas Acp2 may be alternately arranged along the second direction DR2.

The first contact area Acp1 may connect the pixel area Ai(j−1) of the first pixel PXi(j−1) to the pixel area Aij of the second pixel PXij, and the second contact area Acp2 may connect the pixel area Aij of the second pixel PXij to the pixel area Ai(j+1) of the third pixel PXi(j+1). As described above with reference to FIG. 8, the first pixel PXi(j−1) may share the second contact plug CP2' with the third pixel PXi(j+1) arranged in the previous column, and the third pixel PXi(j+1) may share the first contact plug CP1' with the first pixel PXi(j−1) arranged in the next column. Therefore, the pixel area Ai(j−1) of the first pixel PXi(j−1) may be connected to the pixel area of the pixel in the previous column through the second contact area Acp2, and the pixel area Ai(j+1) of the third pixel PXi(j+1) may be connected to the pixel area of the pixel in the next column through the first contact area Acp1.

As a comparative example, a semiconductor pattern may not continuously extend in a row direction, and may include island patterns that are spaced apart from each other. The island patterns included in the pixels may not be connected to each other. Static electricity may be generated (or introduced) from the outside, while a subsequent process is performed after the semiconductor pattern is formed and the like. When the semiconductor pattern includes the island patterns that are spaced apart from each other, the generated (or introduced) static electricity may be isolated in each island pattern. Therefore, the semiconductor pattern affected by the static electricity may be damaged, which may result in defects of the pixels.

However, according to one or more embodiments of the present disclosure, when the semiconductor pattern Act continuously extends in the second direction DR2, the generated (or introduced) static electricity may not be isolated and may be distributed (or moved) in the second direction DR2. Therefore, because the static electricity may not be isolated and may be distributed in the semiconductor pattern Act, damage to the semiconductor pattern Act may be prevented or reduced.

FIG. 10 is a schematic cross-sectional view of a portion of a display apparatus according to another embodiment.

FIG. 10 illustrates portions of each of the first pixel PXi(j−1), the second pixel PXij, and the third pixel PXi(j+1) based on the illustrations of FIGS. 8 and 9, and thus, some components thereof may not be illustrated.

The first pixel PXi(j−1) may include the first emission control transistor T5i(j−1). The second pixel PXij may include the driving transistor T1ij, the first emission control transistor T5ij, and the anode initialization transistor T7ij. The third pixel PXi(j+1) may include the anode initialization transistor T7i(j+1).

The first emission control transistor T5i(j−1) of the first pixel PXi(j−1) may include the active area A5i(j−1), and the gate electrode G. The active area A5i(j−1) of the first emission control transistor T5i(j−1) of the first pixel PXi(j−1) may correspond to a portion of the pixel area Ai(j−1) (e.g., see FIG. 9) of the first pixel PXi(j−1).

The driving transistor T1ij of the second pixel PXij may include the active area A1ij, and the gate electrode G. The first emission control transistor T5ij of the second pixel PXij may include the active area A5ij, and the gate electrode G. The anode initialization transistor T7ij of the second pixel PXij may include the active area A7ij, and the gate electrode G. The active area A1ij of the driving transistor T1ij of the second pixel PXij, the active area A5ij of the first emission control transistor T5ij of the second pixel PXij, and the active area A7ij of the anode initialization transistor T7ij of the second pixel PXij may correspond to portions of the pixel area Aij of the second pixel PXij, respectively.

The anode initialization transistor T7i(j+1) of the third pixel PXi(j+1) may include the active area A7i(j+1), and the gate electrode G. The active area A7i(j+1) of the anode initialization transistor T7i(j+1) of the third pixel PXi(j+1) may correspond to a portion of the pixel area Ai(j+1) (e.g., see FIG. 9) of the third pixel PXi(j+1).

The active area A5i(j−1) of the first emission control transistor T5i(j−1) of the first pixel PXi(j−1) may be connected to the active area A5ij of the first emission control transistor T5ij of the second pixel PXij through the first contact area Acp1. The active area A7ij of the anode initialization transistor T7ij of the second pixel PXij may be connected to the active area A7i(j+1) of the anode initialization transistor T7i(j+1) of the third pixel PXi(j+1) through the second contact area Acp2.

The insulating layers, for example, such as the first gate insulating layer 213, the second gate insulating layer 215, and the interlayer insulating layer 217, may be arranged between the first contact area Acp1 of the semiconductor pattern Act (e.g., see FIG. 9) and the power line PL.

The power line PL may be connected to the first contact area Acp1 of the semiconductor pattern Act through the first contact hole CNT1' formed in the first gate insulating layer 213, the second gate insulating layer 215, and the interlayer insulating layer 217. Part of the power line PL may be buried in (e.g., may extend through) the first contact hole CNT1', and the buried part (e.g., the penetrating part) of the power line PL may be referred to as the first contact plug CP1'. In other words, the first contact plug CP1' may penetrate the insulating layers, and may connect the power line PL to the first contact area Acp1 of the semiconductor pattern Act.

The insulating layers, for example, such as the first gate insulating layer 213, the second gate insulating layer 215, and the interlayer insulating layer 217, may be arranged between the second contact area Acp2 of the semiconductor pattern Act and the second voltage line VL2.

The second voltage line VL2 may be connected to the second contact area Acp2 of the semiconductor pattern Act through the second contact hole CNT2' formed in the first gate insulating layer 213, the second gate insulating layer 215, and the interlayer insulating layer 217. Part of the second voltage line VL2 may be buried in (e.g., may extend through) the second contact hole CNT2', and the buried part (e.g., the penetrating part) of the second voltage line VL2 may be referred to as the second contact plug CP2'. In other words, the second contact plug CP2' may penetrate the insulating layer, and may connect the second voltage line VL2 to the second contact area Acp2 of the semiconductor pattern Act.

The display apparatus has been mainly described above, but the present disclosure is not limited thereto. For example, a manufacturing method of the display apparatus may fall within the scope of the present disclosure.

According to the one or more embodiments of the present disclosure, by integrally forming the semiconductor pattern that continuously extends in one direction, a pixel defect caused by damage to the semiconductor pattern due to external static electricity may be prevented or reduced. Therefore, damage to the display apparatus may be prevented or reduced.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
 a first pixel;
 a second pixel adjacent to the first pixel in a row direction;
 a first vertical power line extending in a column direction crossing the row direction on the first pixel, and configured to deliver a driving voltage to the first pixel;
 a second vertical power line extending in the column direction on the second pixel, and configured to deliver the driving voltage to the second pixel; and
 a semiconductor pattern comprising a first pixel area at the first pixel, a second pixel area at the second pixel, and a connection area connecting the first vertical power line to the second vertical power line,
 wherein the connection area of the semiconductor pattern is at the same layer as that of an active area of the semiconductor pattern of at least one transistor.

2. The display apparatus of claim 1, further comprising:
 an insulating layer between the semiconductor pattern and the first and second vertical power lines;
 a first contact plug penetrating the insulating layer, and connecting the first vertical power line to an end portion of the connection area of the semiconductor pattern; and
 a second contact plug penetrating the insulating layer, and connecting the second vertical power line to another end portion of the connection area of the semiconductor pattern.

3. The display apparatus of claim 1, further comprising:
 a third pixel adjacent to the second pixel in the row direction;
 a first voltage line configured to deliver a first initialization voltage;
 a second voltage line configured to deliver a second initialization voltage; and
 a third contact plug connecting the second pixel and the third pixel to the second voltage line.

4. The display apparatus of claim 3, further comprising:
 a fourth contact plug connecting the first pixel to the first voltage line;
 a fifth contact plug connecting the second pixel to the first voltage line; and
 a sixth contact plug connecting the third pixel to the first voltage line.

5. The display apparatus of claim 3, further comprising:
 a plurality of pixels located along the row direction and the column direction, the plurality of pixels comprising the first to third pixels;
 a plurality of first vertical power lines extending in the column direction, the first vertical power line from among the first vertical power lines being on a pixel in an $i^{th}$ row and a $(j-1)^{th}$ column from among the plurality of pixels, and configured to deliver the driving voltage to the pixel in the $i^{th}$ row and the $(j-1)^{th}$ column;
 a plurality of second vertical power lines extending in the column direction, the second vertical power line from among the second vertical power lines being on a pixel in the $i^{th}$ row and a $j^{th}$ column from among the plurality of pixels, and configured to deliver the driving voltage to the pixel in the $i^{th}$ row and the $j^{th}$ column; and
 a plurality of third contact plugs, the third contact plug from among the third contact plugs connecting the pixel in the $i^{th}$ row and the $i^{th}$ column and a pixel in the $i^{th}$ row and a $(j+1)^{th}$ column to the second voltage line, where i is a natural number and j is an odd or even natural number,
 wherein the semiconductor pattern further comprises a plurality of connection areas connecting the plurality of first vertical power lines to the second vertical power lines.

6. The display apparatus of claim 5, wherein the semiconductor pattern further comprises:
 a plurality of pixel areas included in pixels arranged in the row direction from among the plurality of pixels, respectively; and
 a plurality of contact areas corresponding to the plurality of third contact plugs, respectively.

7. The display apparatus of claim 6, wherein:
 a connection area from among the plurality of connection areas connect a pixel area in the $j^{th}$ row and the $(j-1)^{th}$ column to a pixel area in the $i^{th}$ row and the $j^{th}$ column from among the plurality of pixel areas; and
 a contact area from among the plurality of contact areas connect the pixel area in the $i^{th}$ row and the $j^{th}$ column to a pixel area in the $i^{th}$ row and the $(j+1)^{th}$ column from among the plurality of pixel areas.

8. The display apparatus of claim 6, wherein the plurality of connection areas and the plurality of contact areas are alternately located along the row direction.

9. The display apparatus of claim 5, wherein:
the plurality of first vertical power lines and the plurality of second vertical power lines are alternately located along the row direction; and
the plurality of third contact plugs are located along the column direction.

10. The display apparatus of claim 3, wherein each of the first to third pixels comprises:
a light-emitting element;
a driving transistor configured to control a current flowing in the light-emitting element according to a gate-source voltage;
a scan transistor configured to deliver a data voltage to the driving transistor in response to a first scan signal;
a storage capacitor connected to a gate of the driving transistor, and comprising a first electrode and a second electrode;
a first initialization transistor configured to apply a first initialization voltage to an electrode of the driving transistor in response to a second scan signal; and
a second initialization transistor configured to apply a second initialization voltage to an electrode of the light-emitting element in response to a third scan signal.

11. The display apparatus of claim 1, further comprising:
a first data line extending in the column direction, and configured to deliver a first data voltage to the first pixel; and
a second data line extending in the column direction, and configured to deliver a second data voltage to the second pixel,
wherein the first data line and the second data line are between the first vertical power line and the second vertical power line.

12. The display apparatus of claim 1, wherein the connection area of the semiconductor pattern electrically connects the first vertical power line to the second vertical power line.

13. The display apparatus of claim 1, further comprising a horizontal power line extending on the first pixel and the second pixel in the row direction, and electrically connected to the first vertical power line and the second vertical power line.

14. The display apparatus of claim 1, wherein the connection area is integrally formed with the first pixel area and the second pixel area by a semiconductor material.

15. A display apparatus comprising:
first to third pixels sequentially located along a row direction;
a first voltage line configured to deliver a first initialization voltage;
a second voltage line configured to deliver a second initialization voltage different from the first initialization voltage;
a power line configured to deliver a driving voltage;
a first contact plug located between the first pixel and the second pixel and commonly connecting the first pixel and the second pixel to the power line; and
a second contact plug located between the second pixel and the third pixel and commonly connecting the second pixel and the third pixel to the second voltage line.

16. The display apparatus of claim 15, further comprising:
a third contact plug connecting the first pixel to the first voltage line;
a fourth contact plug connecting the second pixel to the first voltage line; and
a fifth contact plug connecting the third pixel to the first voltage line.

17. The display apparatus of claim 15, further comprising:
a plurality of pixels located along the row direction and a column direction crossing the row direction, the plurality of pixels comprising the first to third pixels;
a plurality of first contact plugs, the first contact plug from among the plurality of first contact plugs connecting the power line to a pixel in an $i^{th}$ row and a $(j-1)^{th}$ column and a pixel in the $i^{th}$ row and a $j^{th}$ column, from among the plurality of pixels; and
a plurality of second contact plugs, the second contact plug from among the plurality of second contact plugs connecting the second voltage line to the pixel in the $i^{th}$ row and the $j^{th}$ column and a pixel in the $i^{th}$ row and a $(j+1)^{th}$ column, from among the plurality of pixels, where i is a natural number and j is an odd or even natural number.

18. The display apparatus of claim 17, wherein:
the plurality of first contact plugs and the plurality of second contact plugs are alternately located along the row direction; and
the plurality of first contact plugs and the plurality of second contact plugs are located along the column direction.

19. The display apparatus of claim 17, wherein:
the power line comprises a plurality of vertical power lines, each extending in the column direction;
the first voltage line comprises a plurality of first vertical lines, each extending in the column direction;
the second voltage line comprises a plurality of second vertical lines, each extending in the column direction;
the plurality of vertical power lines and the plurality of second vertical lines are alternately located along the row direction; and
the plurality of first vertical lines are located between the plurality of vertical power lines and the plurality of second vertical lines, respectively.

20. The display apparatus of claim 19, wherein the power line further comprises a plurality of horizontal power lines, each extending in the row direction, and electrically connected to the plurality of vertical power lines.

* * * * *